(12) United States Patent
Taylor et al.

(10) Patent No.: US 6,524,461 B2
(45) Date of Patent: *Feb. 25, 2003

(54) ELECTRODEPOSITION OF METALS IN SMALL RECESSES USING MODULATED ELECTRIC FIELDS

(75) Inventors: E. Jennings Taylor, Troy, OH (US); Jenny J. Sun, Tipp City, OH (US); Chengdong Zhou, Salem, OR (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/823,749

(22) Filed: Apr. 3, 2001

(65) Prior Publication Data

US 2002/0056645 A1 May 16, 2002

Related U.S. Application Data

(63) Continuation-in-part of application No. 09/553,616, filed on Apr. 20, 2000, now Pat. No. 6,303,014, and a continuation-in-part of application No. PCT/US99/23653, filed on Oct. 14, 1999, and a continuation-in-part of application No. 09/239,811, filed on Jan. 29, 1999, now Pat. No. 6,210,555, which is a continuation-in-part of application No. 09/172,299, filed on Oct. 14, 1998, now Pat. No. 6,203,684.

(51) Int. Cl.$^7$ ................................................ C25D 5/18
(52) U.S. Cl. ..................... 205/103; 205/123; 205/125; 205/920; 205/646
(58) Field of Search ................................. 205/103, 104, 205/123, 125, 126, 920, 646

(56) References Cited

U.S. PATENT DOCUMENTS

| | | | |
|---|---|---|---|
| 5,039,381 A | * 8/1991 | Mullarkey | 204/DIG. 9 |
| 5,476,575 A | * 12/1995 | Brophy et al. | 204/224 M |
| 5,567,300 A | * 10/1996 | Datta et al. | 204/224 M |
| 5,605,615 A | * 2/1997 | Goolsby et al. | 204/229.2 |
| 5,972,192 A | * 10/1999 | Dubin et al. | 205/101 |

OTHER PUBLICATIONS

West, Alan C. et al., "Pulse Reverse Copper Electrodeposition of High Aspect Ratio Trenches and Vias," J. Electrochem. Soc., Vol. 45, No. 9, pp. 3070–3074, Sep. 1998.*

Pletcher, D. and Walsh, F., Industrial Electrochemistry, Second Edition, Blackie Academic & Professional, London, pp. xi–xvi, 79–81, and 109–133, 1990. No month available.*

* cited by examiner

Primary Examiner—Nam Nguyen
Assistant Examiner—Wesley A. Nicolas
(74) Attorney, Agent, or Firm—Vorys, Sater, Seymour and Pease LLP

(57) ABSTRACT

A layer of a metal is electroplated onto an electrically conducting substrate having a generally smooth surface with a small recess therein, having a transverse dimension not greater than about 350 micrometers, typically from about 5 micrometers to about 350 micrometers, by immersing the substrate and a counterelectrode in an electroplating bath of the metal to be electroplated and passing a modulated reversing electric current between the electrodes. The current contains pulses that are cathodic with respect to said substrate and pulses that are anodic with respect to said substrate. The cathodic pulses typically have a duty cycle less than about 50% and the anodic pulses have a duty cycle greater than about 50%, the charge transfer ratio of the cathodic pulses to the anodic pulses is greater than one, and the frequency of the pulses ranges from about 10 Hertz to about 12000 Hertz. The on-time of the cathodic pulses may range from about 0.83 microseconds to about 50 milliseconds. The anodic pulse is longer than the cathodic pulse and may range from about 42 μs to about 99 milliseconds. The plating bath may be substantially devoid of levelers and/or brighteners.

78 Claims, 12 Drawing Sheets

ELECTROPLATED COPPER LAYER

BRASS SUBSTRATE

ELECTROPLATED COPPER LAYER

BRASS SUBSTRATE

DISTANCE FROM THE CATHODE

ELECTRODEPOSITION OF METALS IN SMALL RECESSES USING MODULATED ELECTRIC FIELDS

CROSS-REFERENCE TO RELATED APPLICATIONS

This application is a continuation-in-part of application Ser. No. 09/553,616, filed Apr. 20, 2000, now U.S. Pat, No. 6,303,014, which is a continuation-in-part of applications Ser. No. 09/172,299, filed Oct. 14, 1998, now U.S. Pat. No. 6,203,684 and Ser. No. 09/239,811, filed Jan. 29, 1999, now U.S. Pat. No. 6,210,555 and of International Patent Application No. PCT/US99/23653, filed Oct. 14, 1999, which designated the United States.

ORIGIN OF THE INVENTION

The experimental work leading to this invention was funded in part by U.S. Air Force Materials Command Contract No. F33615-98-C-1273.

BACKGROUND OF THE INVENTION

1. Field of the Invention

This invention relates to electrodeposition of metals and more particularly to electrodeposition of metals into small or microscopic recesses on the surface of a substrate and formation of uniform layers of electrodeposited metal on a substrate.

2. Brief Description of the Prior Art

Electronic devices such as computers, cellular telephones, electronic entertainment devices, and the like, have long been manufactured by mounting components on circuit boards having electrically conductive traces thereon to interconnect the components.

In the manufacture of such electronic equipment, development of technology and economics have driven the industry toward ever-smaller devices, containing ever-increasing numbers of components. At the level of semiconductor devices very large scale integration (VLSI) has produced chips containing up to a few million transistors on a single semiconductor chip no larger than several millimeters on a side. Such chips have conventionally been packaged or encapsulated in small modules having external lead wires for interconnecting the chips. The interconnections have conventionally been provided by circuit boards having electrical conductors prepared by so called "printed wiring" techniques that involve masking, etching, and plating of conductive metal, usually copper, to provide the interconnects between chip modules or sockets designed to hold such modules. These "printed wiring boards" (PWB) have typically been used to interconnect chips of conventional sizes. The chips or socket are mounted on the surface of the board with terminals fitted into holes through the board. The holes are typically lined with a thin layer of copper that is integral with the traces of copper on the surface of the board. The terminals of the chips or sockets are soldered to the copper layer lining the holes and thereby interconnected through the copper traces. The PWBs may have more than one layer of copper traces. Connections between traces in different layers are also provided by copper-lined holes passing through the board, commonly known as plated through-holes (PTHs).

The copper lining in such holes is typically applied electrolytically, by first laying down a thin layer of electroless copper to provide electrical continuity and then electroplating copper to a thickness of a few mils to provide the connecting layer. The holes in the PWBs typically are at least 12–13 mils in diameter. Because of the well-known problem of depositing metal electrolytically in recesses, special techniques have to be used to assure that a uniform layer of conductive metal is deposited in the holes. Consequently conventional techniques to enhance the "throwing power" of the electroplating system have been employed, such as agitation of the bath, addition of certain chemical compounds to the electroplating bath, and/or the use of pulsed current plating.

Although conventional techniques have generally been successful in the manufacture of PWBs having the dimensions that have been commonly used in electronic devices such as television receivers, personal computers, and the like, the trend to ever-smaller equipment such as cellular telephones, more advanced computers, and the like, has led to the necessity of mounting chips closer together in multichip modules (MCMs). Instead of terminals extending into holes in the circuit board, such MCMs frequently have only metallized locations on a major surface of the module to provide interconnections. The semiconductor devices or chips are placed relatively close together on a substrate having holes drilled therein at the locations of the interconnecting pads on the modules. In such boards the holes are typically of smaller diameter than those of conventional PWBs, and may range from about 25 micrometers (1 mil) to about 250 micrometers (10 mils). Such holes are also effectively blind holes, because the semiconductor devices are already mounted to the board, and the conductor deposition step provides the electrical contact to the terminal pads on the semiconductor devices as well as the interconnections between the devices. The use of small chips mounted close together and interconnected by means of conductors deposited in small holes has come to be known as high density interconnect (HDI) technology. With single sided, double sided and multilayers representing the first three generations of PWBs, high density PWBs are also being termed the fourth generation PWB. Other names for this emerging technology includes build up boards and micro via boards.

Deposition of conductive metal into the small, blind holes or vias used in HDI has presented a number of problems. Conventional metallization procedures, such as chemical vapor deposition or physical vapor deposition or electroless plating, are slow and expensive. Electroplating into small blind holes using conventional procedures has not been able to provide a reliable layer of conductive metal in the hole to assure a reliable interconnection of the chips. In particular, conventional electroplating techniques tend to deposit excess metal at the sharp corners at the top or entrance of the hole. Such deposits encroach on the opening of the hole and hinder deposition in the lower portion of the hole. They may even completely block the mouth of the hole leading to voids in the vias or interconnects. Additionally, in some cases it is desirable to obtain a conformal deposit, which is also adversely affected by dogboning at the corners of the vias. Furthermore, chemical additives in the plating bath may lead to inclusions of impurities derived from the plating bath within the metal deposit. Such problems can lead to connections that have a high electrical resistance and are mechanically brittle and unreliable in service. In addition, the use of nonconventional electroplating techniques such as pulse current plating, typically in conjunction with chemical additives, has relied on waveform parameters successfully developed for traditional PWB applications, such as 13 mil and greater PTHs. These waveforms generally operate with long cathodic duty cycles and short anodic duty cycles. This approach has led to similar problems encountered in conventional plating with excess metal deposit at the opening of the via leading to voids in the interconnect or to excessive deposit of metal on the surface of the substrate. In addition to the problems cited above, such nonuniform metallization within the via or between the via and the substrate results in excessive processing time and cost associated with the excess metal.

Similar problems regarding the electrodeposition of metallic conductors are encountered in the manufacture of the semiconductor devices themselves that are mounted on the circuit boards and interconnected by conductive traces.

The manufacture of semiconductor devices, especially very large scale integrated (VLSI) as well as ultra large scale integrated (ULSI) chips is driven by technical and economic considerations toward the production of devices comprising greater numbers of transistors and associated circuits on a single semiconductor chip or wafer. For clarity, VLSI is meant to include both VLSI and ULSI chips. The most complex chips manufactured today have a few million transistors on a semiconductor chip no larger than several millimeters on a side. The electrical interconnections between the transistors in such chips are provided by fine wires of a conductive metal extending in channels formed horizontally and vertically in the body of the chip. Conventionally, these electrical connections have been made of aluminum, which can be deposited through vapor phase deposition techniques such as physical vapor deposition (PVD) and chemical vapor deposition (CVD). However, as the dimensions of the transistors have decreased into the submicron region, the cross sections of the connections have also decreased and the resistance of the connections has increased. In order to reduce the resistance of the connections in VLSI circuits containing devices of submicron dimensions, the use of copper as a connecting material has come to be favored.

Furthermore, as the dimensions of the interconnections between the devices have decreased, the use of conductors of high aspect ratio has become desirable. When VLSI devices are prepared by the damascene process, which requires that the conducting metal be deposited into trenches formed in a layer of insulating material, it has been found difficult to achieve void-free metal deposits in trenches having high aspect ratios by PVD or CVD.

Attempts have been made to deposit copper conductors into trenches on damascene-prepared surfaces by electroplating. However, it has proved difficult to prepare void-free, and inclusion-free deposits in trenches of high aspect ratio. Furthermore, electroplating of copper into trenches of a damascene-prepared surface has required depositing a relatively thick layer of copper over the entire surface of the wafer. The excess copper must then be removed by chemical-mechanical polishing (CMP), which is a time-consuming process that also generates substantial amounts of waste slurries that require careful and expensive disposal procedures.

Electroplating has also been used to deposit a thin layer of copper on the surface of a large semiconductor wafer preparatory to forming electrical interconnections by the customary masking and etching procedures. However, because of the tendency of electroplating procedures to deposit excess metal at the edges of the wafer, it has proved difficult to prepare perfectly uniform layers of copper. Auxiliary electrodes have been used to surround the edges of the wafer in order to provide a uniform electric field, as disclosed, for example in U.S. Pat. No. 5,135,636, to Yee et al. However, such procedures require additional equipment and are evidently wasteful of copper metal.

Accordingly, a need has continued to exist for a method of depositing metals in small or microscopic recesses on a substrate in a controlled and efficient manner. In particular, a need has continued to exist for a method of depositing metallic conductors, especially copper, into small recesses such as the blind holes used in high density interconnects for multichip modules and the like and damascene trenches on semiconductor wafers, as well as for depositing a thin uniform layer of a metal such as copper over the entire surface of a semiconductor wafer with minimal need for subsequent planarization. Fabrication of other microtechnologies such as micromechanical machines (MEMS) also require metallization of a small feature followed by planarization.

SUMMARY OF THE INVENTION

The problems encountered in electrodeposition of continuous conductive layers of metals into small blind holes and vias have now been alleviated by the method of this invention, wherein a metal is selectively deposited on a substrate to provide a coating that lines or fills small blind holes and/or recesses without excessive deposition of metal at or near convex portions of the substrate surface such as protuberances and edges. The selective deposition is accomplished by a process in which an electrically conductive substrate having a blind hole, groove, trench, or other small or microscopic recess with at least one transverse dimension not greater than about 350 micrometers is immersed in an electroplating bath containing ions of the metal to be deposited in said recess, and provided with a suitable counterelectrode, and a modulated reversing electric current is passed through the plating bath having pulses that are cathodic with respect to the substrate and pulses that are anodic with respect to the substrate, the cathodic pulses having a short duty cycle and the anodic pulses having a long duty cycle, the charge transfer ratio of the cathodic pulses to the anodic pulses being greater than one or effectively greater than one when the current efficiencies of the cathodic and anodic processes are taken into account, and the frequency of the pulses ranging from about 10 Hertz to about 12 kilohertz.

The plating bath used with the method of the invention may be substantially devoid of levelers and or brighteners.

Accordingly, it is an object of the invention to provide an electrochemical method for depositing a metal on a substrate.

A further object is to provide a method for selective electrodeposition of a metal on a substrate having small or microscopic recesses on its surface.

A further object of the invention is to provide an electrochemical method for depositing, either by filling or by conformal coating, a metal in small blind holes in a substrate.

A further object is to provide a method for depositing metal from an electrolytic bath onto a substrate having recesses therein in order to provide reliable electrical connection between the surface of the substrate and the bottom portion of the recess.

A further object is to provide a method for forming a void-free deposit of metal in a small recess on the surface of a substrate.

A further object is to provide a method for electrodepositing metal into a small recess on the surface of a substrate without excessive deposition of metal on the surface of the substrate.

A further object is to provide a method for depositing metal from an electrolytic bath onto a substrate while preventing excessive deposition at corners and protuberances of the substrate.

A further object is to provide a method for electrodepositing metal into a small recess on the surface of a substrate using a plating bath substantially devoid of levelers.

A further object is to provide a method for electrodepositing metal into a small recess on the surface of a substrate using a plating bath substantially devoid of brighteners.

A further object is to provide a method for electrodepositing a metal into a small recess on the surface of a substrate using a plating bath substantially devoid of levelers and brighteners.

Further objects of the invention will become apparent from the description of the invention which follows.

DETAILED DESCRIPTION OF THE INVENTION AND PREFERRED EMBODIMENTS

The distribution of metal electrodeposited on an electrically conductive substrate is determined by the local variations in the electrical current density. The primary current distribution in an electroplating cell is determined by the geometry of the electrodes. Typically, the primary current density is inversely proportional to the distance between the cathode and the anode along the path that the current follows between the electrodes.

Figure 2A:
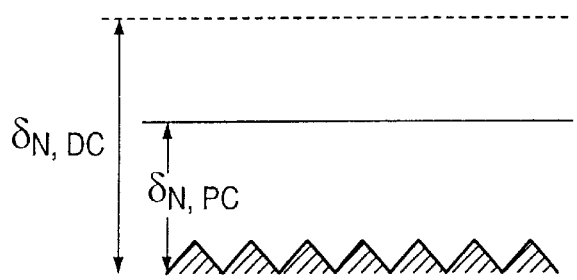
FIG. 2A illustrates the thickness of the Nernst diffusion layer with respect to the surface roughness of an electroplating substrate having a microrough surface.
Figure 2B:
FIG. 2B illustrates the thickness of the Nernst diffusion layer with respect to the surface roughness of an electroplating substrate having a macrorough surface.

When a voltage is first applied to the electroplating cell, the metal ions in solution in contact with the cathode are deposited on the cathode and the concentration of the ions in the adjacent solution decreases. Consequently, a concentration gradient is established near the cathode, and metal ions accordingly diffuse from the bulk solution region of relatively high concentration toward the depleted region adjacent to the cathode. This layer of depleted and variable metal ion concentration is the Nernst diffusion layer. In direct-current (DC) electroplating, the Nernst diffusion layer will rapidly reach a steady-state thickness that is determined by the current density and the degree of agitation of the bath which produces a relative motion of the bulk electrolyte with respect to the electrode ($\delta_{N,DC}$ in FIGS. 2A, 2B and 2C). The more vigorous the agitation of the electrolyte in the plating bath, the thinner the Nernst diffusion layer will be. However, even for very vigorous relative motion between the bulk electrolyte and the electrode, e.g., with use of a rotating disk electrode, the thickness of the Nernst diffusion layer will still amount to several micrometers. The substrate surface will not, in general, be perfectly smooth. If the roughness of the surface, i.e., the size of the peaks and valleys therein, is large compared with the thickness $\delta_{N,DC}$ of the Nernst diffusion layer (a "macrorough" surface), the layer will tend to follow the surface asperities, as shown in FIG. 2B. Under these circumstances the electric field which determines the primary current distribution will be greater at the tips of the asperities than in the valleys. Accordingly, electrochemical reduction, i.e., deposition of metal, will take place preferentially at the peaks. The current flow in the electrolyte will establish a somewhat greater overpotential in the depressions of a macrorough surface than at the peaks, which will tend to provide a secondary current distribution that still favors metal deposition at the peaks, although perhaps not as much as the primary current distribution.

FIG. 2B indicates that, on a macrorough surface, the Nernst diffusion layer follows the contour of the surface asperities. Accordingly, the distribution of electrodeposited metal is not greatly affected by microvariations in current distribution caused by microasperities, as is the case for microrough substrates, as illustrated in FIG. 2A and discussed below. Therefore the thickness of the metal deposit on the peaks and valleys of a macrorough surface is determined essentially by the primary and secondary current distribution.

In conventional electroplating of industrial objects, the dimensions of any surface features are large with respect to the thickness of the Nernst diffusion layer. This relationship extends even to relatively small articles such as printed circuit boards, where the smallest features, e.g., through-holes, typically have dimensions of the order of 10–15 mils.

In electroplating of substrates having surface features significantly smaller than the Nernst diffusion layer, such as semiconductor wafers, the diffusion layer when plating is conducted using direct current (DC) not follow the microscopic peaks and valleys of the surface, as illustrated in FIG. 2A. For such "microrough" surfaces, the current distribution will also favor the deposition of metal at the peaks of the asperities, once the diffusion layer is established, because the concentration of metal ions, as determined by their rate of diffusion from the bulk phase, will tend to be slightly greater at the peaks. Such a current distribution is generally referred to as the tertiary current distribution.

Figure 2C:
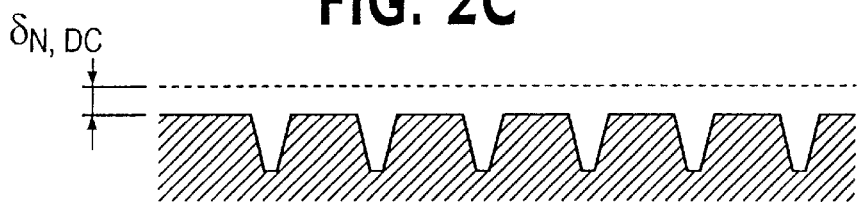
FIG. 2C illustrates the thickness of the Nernst diffusion layer with respect to a substrate having small recesses having transverse dimensions of about 5 micrometers to about 350 micrometers and aspect ratios of from about 0.5 to about 5.

When the substrate has a relatively smooth surface with trenches or holes therein having a transverse dimension in the range of from about 5 micrometers to about 350 micrometers, the relationship of the Nernst diffusion layer to the surface profile is more complex, and predictions regarding the behavior of the electrochemical deposit are more difficult. Such a surface is illustrated in FIG. 2C. Because the transverse dimension of the recesses, e.g., the diameter of a hole, are similar in magnitude to the thickness of the Nernst diffusion layer under the conventional conditions of agitation of the plating bath and DC plating, the entire interior of the recess is hydrodynamically inaccessible and within the diffusion layer. Evidently, the diffusion distance for transport of metal ions into the recess is substantially greater than for the transport of metal ions through the thinner diffusion layer adjacent to the surface. Under these circumstances predictions regarding the best conditions for producing a good deposit of metal within the recess are difficult.

On semiconductor wafers the surface features are typically smaller than about 5 micrometers. These surface features may be residual roughness from the cutting and polishing processes used in preparing the wafer. On damascene-prepared semiconductor wafers of current manufacture the trenches and vias may have transverse dimensions ranging from less than about 5 micrometers to less than one micrometer, e.g., down to 0.25 micrometer, 0.18 micrometer, or less. Surface features of such dimensions are substantially less than the thickness of the Nernst diffusion layer under any practical manufacturing conditions. Accordingly, semiconductor surfaces may be considered to be microrough, whether they are encountered in the unprocessed wafer or deliberately prepared in the course of manufacturing a VLSI chip.

In DC electroplating it is conventional to counteract the tendency of the metal to be deposited preferentially at the peaks of the surface asperities by adding certain chemicals to the plating bath to improve its "throwing power." These additives help to produce a level coating of the metal. However, experience with such additives has been generally confined to electroplating onto macrorough substrates, and their mode of operation is not entirely understood. The additives are used in small amounts, and different applications have typically used different formulations. Consequently, the effectiveness of such additives for producing a uniform deposit of metal in small recesses cannot be predicted, and it would be expected that development of additives suitable for enhancing throwing power under these conditions would require extensive experimentation. Furthermore, because very small concentrations of additives are used, the measurement and control or replenishment of the additive concentration presents substantial difficulties. Finally, the additives may be occluded within the metal deposit. Such inclusions may cause increased resistance and quality control problems. The use of conventional plating bath additives is not excluded in the process of the invention, but it is preferred to minimize their use to avoid the problems indicated above.

These different classes of materials are included in the plating bath in order to achieve certain characteristics of the deposit, and their terminology reflects the purpose for which they are used. These materials are included in the plating bath for specific purposes, and the terminology used to identify them generally describes the effect that they produce. The purpose of these material and their nomenclature is summarized in Mikkola et al., Plating and Surface Finishing, March 2000, pages 81–85, the entire disclosure of which is incorporated herein by reference.

In many metal plating baths small amounts of organic compounds are added, typically in concentrations of a few parts per million, in order to achieve a bright, shiny surface on the deposited metal. Such compounds, generally referred to as brighteners, tend to produce an even, fine-grained deposit, and are thought to operate by their effect on the nucleation of the metal grains. These compounds typically contain sulfur and other functional groups, and include such compounds as thiourea, and derivatives thereof, mercaptopropane sulfonic acid and the like.

A second class of additive compounds, also present in small amounts (typically a few parts per million), are those that produce a level deposit ("levelers"), i.e., a smooth deposit that fills in microscopic irregularities in the plating substrate. They are believed to operate by selective adsorption to readily accessible surfaces such as protruding high points or flat surfaces, whereby they decrease the rate of electrodeposition at those locations. Such compounds include polyamines, derivatives of safronic dyes, and the like.

Both the brighteners and levelers are consumed in the course of electroplating. Consequently, their concentration must me monitored and controlled by periodic additions. Because the concentrations are low and the amounts to be added are small, the control of the brightener and leveler concentrations presents some problems for the electroplater.

Another type of compound that is included in the bath for certain metals is generally known as a carrier or suppressor. Such compounds are typically used with metals that are plated efficiently, such as copper and zinc. The are believed to have a beneficial effect on the grain size of the deposit because they are adsorbed to the surface and decrease the rate of deposition. Such compounds are typically present in a concentration substantially greater than that of the brighteners and levelers, typically 100 parts per million or greater. Accordingly, it is significantly easier to control the concentration of a carrier compound than of a leveler or brightener. Suppressors or carriers include polyhydroxy compounds such as polyglycols, e.g., poly(ethylene glycol), poly(propylene glycol), and copolymers thereof.

Improved control of the plating deposit over that achievable using with DC plating and conventional plating bath additives is possible because it is also possible to control the deposition of metal by using a modulated electric field.

According to the invention, it has been found that it is possible to dispense with the levelers and brighteners and still achieve uniform filling of small recesses, such as trenches and vias, in circuit board substrates intended for use in high density interconnect circuits. For depositing copper in such small recesses it is still useful to use a carrier (or suppressor) compound, in a concentration of from about 100 parts per million to about 5% by weight of the plating bath. A preferred suppressor compound is poly(ethylene glycol). and a preferred concentration is from about 200 parts per million (ppm) to about 800 parts per million, more preferably about 300 parts per million. The poly(ethylene glycol) may range in molecular weight form about 1000 to about 12000, preferably from about 2500 to about 5000. The suppressor is typically used in combination with chloride ion in a concentration of about 40–200 parts per million, preferably about 50 parts per million. Therefore, it is in accordance with the invention to deposit a metal by electrodeposition into small trenches and vias during fabrication of semiconductor devices using a modulated reversing electric field, using a plating bath that is substantially devoid of levelers and/or brighteners.

As explained in U.S. Pat. No. 5,599,437, to Taylor et al., the entire disclosure of which is incorporated herein by reference, the use of a pulsed electric field, which produces a corresponding pulsed current through the electroplating cell, causes a more uniform deposition of metal over the entire surface of a microrough substrate. In general, the shorter the cathodic pulse, the more uniform the electrodeposition will be, because the concentration of metal ions immediately adjacent all portions of the substrate surface will more closely approach the initial bulk concentration in the electrolyte. This increased uniformity of electrolyte concentration is related to the thinner average thickness of the Nernst diffusion layer when a pulsed current is used ($\delta_{N,PC}$ in FIGS. 2A, 2B and 2C). The longer the pulse duration, the thicker will be the Nernst diffusion layer, and the more the current distribution and the corresponding distribution of plated metal will approach the current and metal deposition pattern characteristic of direct-current plating. In addition, in order to increase the degree of tertiary current distribution control, high cathodic peak currents are required.

In the case of the macrorough surface (FIG. 2B) the thinner pulsed-current (PC) diffusion layer is not qualitatively different from the diffusion layer produced by DC electrolysis; both generally conform to the asperities of the substrate surface. Under such conditions, as suggested by Ibl (Ibl, N., 1981, in Proceedings of the Second International Pulse Plating Symposium, American Electroplaters and Surface Finishers Society (AESP), Winter Park, Fla.), the primary current distribution will prevail and the plating will in general be less uniform than for DC plating. However, for the microrough surface, the Nernst diffusion layer becomes relatively thicker with respect to the microasperities as the pulses become longer. Accordingly, the metal distribution will become more like that produced by direct-current plating, i.e., preferential deposition of metal on the peaks, or convex portions, of the microscopic asperities.

Conversely, if a microrough metal surface having small recesses is made the anode in an electrolysis cell using direct current, the tertiary current distribution will favor removal of metal from the surface over removal of metal from the small recesses in the surface. In this case also, short pulses tend to remove metal uniformly or conformally from the entire surface which includes the recess. However, longer anodic pulses will tend to approach the non-uniform metal removal observed with direct current electrolysis and to remove metal preferentially from the surface and not the recess itself. Since the relatively long anodic duty cycle necessitates a relatively small anodic peak current in order to maintain a net cathodic process, it is also likely that primary current distribution control will be in effect for a large fraction of the anodic process. Further, under primary current distribution control the metal is preferentially removed from the surface and not the recess itself.

According to the invention, a substrate having a relatively smooth surface with small recesses therein, having a transverse dimension in the range of from about 5 micrometers to about 350 micrometers, can be electroplated with a layer of metal that follows the contours of the surface and recesses or fills the recesses without excessive deposition of metal on the surface of the substrate by using a modulated electric field in which cathodic and anodic pulses are applied successively. Relatively short cathodic pulses are applied to favor uniform deposition of metal over the exterior surface of the substrate and the interior surface of the recesses. The relatively short cathodic pulses are followed by relatively long anodic pulses, which favor removal of metal preferentially from the surface. Preferably the relatively long anodic pulses are interspersed frequently between the relatively short cathodic pulses, and may even alternate with the short cathodic pulses.

Under such PC conditions, with a surface profile as shown in FIG. 2C, the extent to which the Nernst diffusion layer conforms to the surface profile is difficult to predict. Accordingly, the Nernst diffusion layer for PC is not indicated in FIG. 2C. However, short cathodic pulses tend to reduce the thickness of the Nernst diffusion layer, as discussed above. Therefore, short cathodic pulses can, in principle, cause the diffusion layer to follow the surface profile closely, whereby the deposition of metal is still controlled by the tertiary current distribution, which favors uniform deposition of metal over the entire surface of the substrate including the small recesses.

When the invention is applied to the deposition of metal on a microrough surface, a metal layer having a planar smooth surface can be deposited on such a surface by using a modulated electric field in which cathodic and anodic pulses are applied successively. Relatively short cathodic pulses are applied to favor deposition of metal over both the peaks or convex portions of the microrough surface as well as the depressions or concave portions of the surface. The relatively short cathodic pulses are folowed by relatively long anodic pulses, which favor the non-uniform removal of metal preferentially from the peaks or convex portions of the microrough surfaces. Preferably the relatively long anodic pulses are interspersed frequently between the relatively short cathodic pulses, and may even alternate with the short cathodic pulses.

The method of the invention can also be applied to deposition of metal conductors in damascene-prepared trenches on surfaces that have already been made very smooth, such as in the fabrication of very large scale integrated (VLSI) semiconductor devices. In such an application, the relatively short cathodic pulses will favor uniform deposition of metal into the trenches as well as onto the surface. The subsequent relatively long anodic pulses will favor dissolution of metal from the planar surface while tending to leave metal that has already been deposited in the trenches. As a result, when the full depth of the trenches has been filled with metal, the depth of the metal layer on the on the surface of the wafer will be significantly less than that in the trenches. Accordingly, the excess metal that has to be removed from the surface, e.g., by chemical-mechanical polishing (CMP), to planarize the chip and isolate the conductors is substantially less than that which would have been deposited without the use of the modulated reverse field.

The method of the invention may also be applied to depositing a thin planar layer of a metal uniformly across the surface of a substrate, e.g., a large semiconductor wafer having a diameter of up to 8 inches or greater. Such wafers are typically initially polished to a very smooth surface having deviations from planarity of the order of no more than several nanometers. Thereupon, a layer of electrically conductive metal, e.g., copper is deposited on the surface, and the metal layer is subsequently masked and etched by conventional procedures to form electrical connections between devices. As the process is currently implemented, the layer of conductive metal is of the order of one micrometer in thickness, and may be slightly thinner or slightly greater, depending on the engineering requirements for manufacturing a particular VLSI integrated circuit. In this application, the deposition of metal using modulated reverse electric fields will also tend to fill preferentially any microdepressions remaining in the surface of the wafer. However, a more important result is to prevent deposition of a non-uniform layer having an excessive thickness near the edge of the wafer. Any excess metal deposited during the relatively short cathodic pulses is preferentially depleted during the longer anodic pulses. Consequently, the method of the invention tends to produce plated semiconductor wafer wherein the metal layer is uniform across the entire wafer, even to the edges. The method of the invention may also be applied to depositing a thin planar layer of a metal uniformly across the surface of a substrate for fabrication of other microtechnologies such as MEMS.

Figure 1:
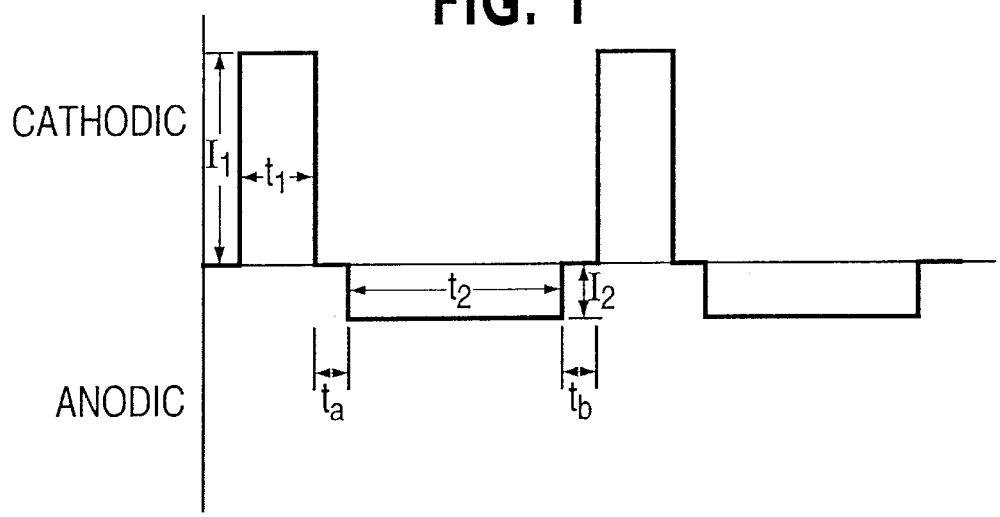
FIG. 1 illustrates the waveform of modulated reverse electric current used in the method of the invention.

A schematic representation of a rectangular modulated reverse electric field waveform used in the process of the invention is illustrated in FIG. 1. The waveform essentially comprises a cathodic (forward) pulse followed by an anodic (reverse) pulse. An off-period or relaxation period may follow either or both of the cathodic and anodic pulses. Those skilled in the art will recognize that the voltage and current will be proportional under the circumstances of the electrolytic process of the invention. Accordingly, the ordinate in FIG. 1 could represent either current or voltage. Although it is generally more convenient in practice to control the voltage, the technical disclosure of the process is more straightforward if discussed in terms of the current flow. Furthermore, the waveform need not be rectangular as illustrated. The cathodic and anodic pulses may have any voltage-time (or current-time) profile. In the following discussion rectangular pulses are assumed for simplicity. Again, one skilled in the art will recognize that the point in time chosen as the initial point of the pulse train is entirely arbitrary. Either the cathodic pulse or the anodic pulse (or any point in the pulse train) could be considered as the initial point. The representation with the cathodic initial pulse is introduced for simplicity in discussion.

In FIG. 1, the cathodic peak current is shown as $I_1$ and the cathodic on-time is $t_1$. Similarly, the anodic peak current is shown as $I_2$ and the anodic on-time is $t_2$. The relaxation time, or off-times are indicated by $t_a$ and $t_b$. The sum of the cathodic on-time, anodic on-time, and off-times (if present) is the period T of the pulse train ($T=t_1+t_2+t_a+t_b$), and the inverse of the period of the pulse train (1/T) is the frequency (f) of the pulse train. The ratio of the cathodic on-time to the period ($t_1/T$) is the cathodic duty cycle ($D_1$), and the ratio of the anodic on-time to the period ($t_2/T$) is the anodic duty cycle ($D_2$). The current density, i.e., current per unit area of the electrode, during the cathodic on-time and anodic on-time is known as the cathodic peak pulse current density and anodic peak pulse current density, respectively. The cathodic charge transfer density ($Q_1$) is the product of the cathodic current density and the cathodic on-time ($I_1T_1$), while the anodic charge transfer density ($Q_2$) is the product of the anodic current density and the anodic on-time ($I_2T_2$). The average current density ($i_{ave}$) is the average cathodic current density ($D_1I_1$) minus the average anodic current density ($I_2D_2$). Accordingly the relationships among the parameters may be represented by the following equations.

$$T = \frac{1}{f} = t_1 + t_2 + t_a + t_b \tag{1}$$

$$D_1 = \frac{t_1}{T} \tag{2}$$

-continued $$D_2 = \frac{t_2}{T} \quad (3)$$

$$\frac{Q_1}{Q_2} = \frac{i_1 t_1}{i_2 t_2} \quad (4)$$

$$i_{ave} = i_1 D_1 - i_2 D_2 \quad (5)$$

$$D_1 + D_2 = 1 \quad (6)$$

According to the invention the cathodic duty cycle should be relatively short, less than about 50%, and the cathodic pulses should be relatively short to favor uniform deposition of metal on both the concave (trenches) and convex (peaks) portions of the substrate surface. Preferably, the cathodic duty cycle is from about 30% to about 1%, more preferably from about 30% to about 15% and still more preferably from about 30% to about 20%.

Conversely, the anodic duty cycle should be relatively long, greater than about 50%, and the anodic pulses should be relatively long in order to favor removal of excess metal from the convex and peak portions of the substrate surface. Preferably, the anodic duty cycle is from about 60% to about 99%, more preferably from about 70% to about 85% and still more preferably from about 70% to about 80%. Because the anodic duty cycle is longer than the cathodic duty cycle, the peak anodic voltage (and corresponding current) will be less than the peak cathodic voltage (and corresponding current). Accordingly, the cathodic-to-anodic net charge ratio will be greater than one, in order to provide a net deposition of metal on the surface. Although the anodic removal of excess metal reduces the overall efficiency of the electroplating process, the benefits of filling or uniformly coating the trenches or blind vias required for high density interconnects or filling the trenches in damascene-prepared surfaces and of avoiding excessive plating thickness at the edges of plated wafers more than compensate for any loss in electroplating efficiency.

The frequency of the pulse train used in the method of the invention may range from about 10 Hertz to about 12000 Hertz, preferably from about 100 Hz to about 10000 Hz, more preferably from about 100 Hz to about 6000 Hz. It is generally preferable to use lower frequencies when plating the larger recesses within the useful range, e.g., from about 25 micrometers to about 350 micrometers. Such frequencies might range from about 100 Hz to about 3000 Hz and more preferably from about 500 Hz to about 1500 Hz. Higher frequencies are generally more useful for plating smaller recesses, e.g., less than about 25 micrometers. Such frequencies may range from about 2500 Hz to about 12000 Hz, more preferably from about 4000 Hz to about 10000 Hz. Accordingly, the cathodic and anodic pulse widths may vary from about 1.0 microsecond to about 100 milliseconds. Generally, as the feature size decreases or the aspect ratio increases, higher frequencies and/or lower cathodic duty cycles are preferred. An anodic pulse is introduced between at least some of the cathodic pulses. However, it is not excluded that two or more cathodic pulses may be introduced between a pair of anodic pulses. In particular, a plurality of very short cathodic pulses may be followed by one relatively long anodic pulse. Accordingly, a number of cathodic and anodic pulses with defined pulse widths may make up one group of pulses, which is then repeated. Typically such a group would include one or more cathodic pulses and at least one anodic pulse. The period of a pulse train comprised of such pulse groups may conveniently be defined as the time from the beginning of one cathodic pulse to the beginning of the next cathodic pulse that is similarly situated in the pulse train. The frequency of the pulse train may then be defined as the reciprocal of the period, as discussed above.

The pulse width, duty cycle, and applied voltage of the cathodic and anodic pulses must be adjusted to provide that the overall process is cathodic, i.e., there is a net deposition of metal on the substrate workpiece. Consequently, the charge ratio will generally be greater than 1. However, because the relative current efficiencies of the plating and deplating portions of the cathodic-anodic pulse cycle, it is possible in some cases to observe net deposition of metal with a applied charge ratio somewhat less than one, e.g, as low as 0.90 or even less. The practitioner will adapt the pulse width, duty cycle, and frequency to a particular application, based on the principles and teachings of the process of the invention.

Although applicants do not wish to be bound by theory, some considerations regarding the theory of electrodeposition of metal under pulsed current may help to understand the operation of the invention.

As indicated above, when a voltage is first applied to an electrolytic cell the concentration of electroreactive species at the surface begins to differ from that in the bulk solution. In particular, if a metal is being deposited or plated onto the surface of an electrode the concentration of metal ions adjacent to the electrode decreases, whereby a concentration gradient is established in the region adjacent to the electrode. Metal ions then diffuse from the bulk electrolyte toward the electrode. After a certain time a steady state is reached in which a layer of depleted concentration of reactive species, e.g., metal ions, adjacent to the electrode surface. This layer is the Nernst diffusion layer. The thickness of the Nernst diffusion layer will evidently depend on the degree of agitation of the electrolyte bath and the magnitude of the current. In a typical electroplating cell using direct current (DC) the Nernst diffusion layer has been found to have a thickness of about 75 micrometers under conventional conditions of bath agitation and electrolyte concentration. Inasmuch as the thickness of the Nernst diffusion layer under steady-state Dc electroplating conditions is determined principally by the electrolyte agitation, it may be referred to as the hydrodynamic diffusion layer.

Figure 18:
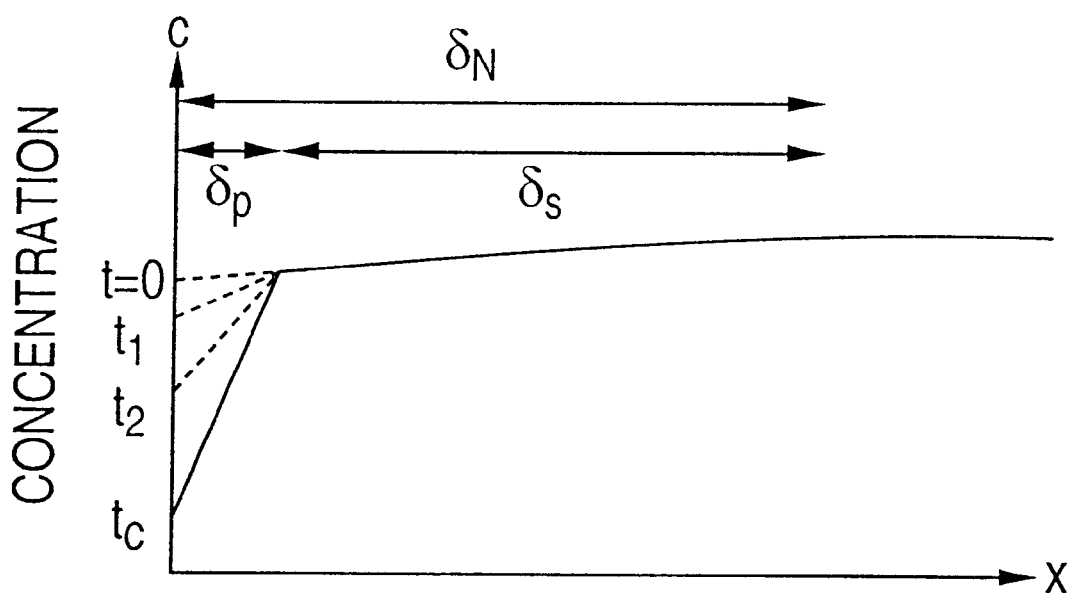
FIG. 18 shows the electrodynamic diffusion layer having a fluctuating concentration of electroactive species close to the surface of the substrate when pulsed current is used.

When pulsed current is used to effect an electrochemical reaction, e.g., metal deposition, at an electrode surface, the layer adjacent the surface can be at least partially replenished by diffusion from the bulk electrolyte during the periods when the cathodic or deposition current is not flowing, specifically during the off-times and the anodic or reverse times. The diffusion layer is then reestablished at the beginning of each pulse. Under such conditions, there will still be a net depletion of reactive species, e.g., within the diffusion layer, but the concentration at the electrode surface and immediately adjacent thereto may fluctuate. A good approximation to the actual conditions has been proposed by Ibl, N., et al., *Surface Technology* 6, p. 287 (1978), wherein the diffusion layer is modeled as a duplex diffusion layer. As illustrated in FIG. 18, the duplex diffusion layer $\delta_N$ comprises an outer steady-state diffusion layer $\delta_s$ and an inner fluctuating diffusion layer $\delta_p$. The thickness of the entire duplex diffusion layer $\delta_N$ is still determined by hydrodynamic conditions and may be considered to be a hydrodynamic diffusion layer. However, the thickness of the inner fluctuating layer $\delta_p$ is principally determined by the parameters of the current pulses, e.g., duration, amplitude and the like. Accordingly, the fluctuating inner diffusion layer may be described as an electrodynamic diffusion layer. Its thickness, as shown in FIG. 18 may be calculated as $$\delta_p = (2Dt_c)^{1/2} \quad (7)$$

where:

δp = thickness of the electrodynamic diffusion layer;
D = the diffusion constant for the electroactive species; and
$t_c$ = the on-time of the cathodic current pulse.

FIG. 18 illustrates the development of the electrodynamic diffusion layer from the initiation of the pulse at $t_o$, through the intermediate times $t_1$ and $t_2$ to the end of the cathodic pulse at time $t_c$. If the cathodic pulse is long enough, the concentration of the electroactive species, e.g., a metal to be plated, may reach zero at the surface of the the cathodic substrate, with consequences discussed below. The same equation has also been shown to apply to plating with reversed current pulses. It is evident by inspection of equation (7) that the thickness of the electrodynamic diffusion layer is proportional to the square root of the cathodic pulse on-time. Accordingly, the electrodynamic diffusion layer can be made substantially thinner than the steady-state hydrodynamic diffusion layer by using short cathodic pulses.

The relative thickness of the electrodynamic diffusion layer and the time required for it to be established at the surface of a substrate to be electroplated is believed to have an effect on the distribution of the deposited metal in small recesses. The application of such considerations to the electroplating process enables the practitioner to control the distribution of the plated metal within small recesses on the substrate surface.

Metal distribution on a plated substrate is determined by the current distribution. The current distribution is in turn determined, as is well-known, by three principal factors.

1) Geometry of the electrolytic cell (primary current distribution): The flow of current tends to be concentrated at peaks of asperities on the substrate. This primary current distribution favors a nonuniform deposition of metal on the high points or peaks of the substrate surface.

2) Kinetics of the electrode reaction (secondary current distribution): The overpotential produced by the kinetics of the electrode reaction tends to be greater at the peaks of the asperities. This tends to reduce the difference in current density between the peaks and valleys of the substrate surface. Consequently, the distribution of deposited metal under secondary current distribution is more uniform than that under primary current distribution, although it still favors deposition of metal at the peaks of the substrate surface.

3) Mass transport (tertiary current distribution): If the Nernst diffusion layer is substantially thinner than the vertical dimensions of the substrate surface asperities, the diffusion layer will follow the uneven surface, as pointed out above. Consequently, the effect of mass transport across the Nernst diffusion layer will not vary from peak to valley of the substrate surface. However, the current distribution across a microrough surface, i.e., a surface having asperities that are significantly smaller than the thickness of the diffusion layer, will be nonuniform, favoring deposition at the peaks of the microasperities.

The same considerations apply to electrolytic removal of metal from a substrates surface, i.e., by making the surface anodic with respect to a counterelectrode.

In view of the above discussion it will be apparent that the deposition and removal of metal from a substrate surface is in general nonuniform, although the magnitude of the non-uniformity may differ with the conditions prevailing in a particular case.

According to the invention, it is possible to control the conditions for depositing a metal on a substrate having features, e.g., recesses such as vias and trenches, with transverse dimensions of the order of the thickness of the Nernst diffusion layer or smaller, in order to produce an electrodeposited layer of metal on the surface that may conform to the surface features or fill the features with solid metal. In general, according to the invention, by using controlled pulse reverse current (or voltage) it is possible to balance the generally nonuniform processes of plating and removal to yield a deposit that may be conformal or feature-filling.

Generally, the primary current distribution is controlled by the geometry of the plating cell, e.g., electrode spacing and the like. Accordingly, the primary current distribution is not controlled by the waveform of the plating current.

Typically, for substrates with small recesses the secondary current distribution would not be expected to vary greatly between the generally flat surface of the substrate and the walls and bottoms of the trenches, vias, etc. in the surface.

However, the presence or absence, of tertiary distribution and its control can have a significant effect on the deposition and/or removal of metal from the substrate surface when the surface features have dimensions of the order of the Nernst diffusion layer or smaller.

Tertiary or mass transport effects become important when the concentration of reacting species at the electrode surface is small or zero. Under these conditions, as noted above, the rate of deposition of metal is determined by the rate of diffusion through the Nernst diffusion layer. The time required for the diffusion layer to develop can be characterized by the time for the concentration of reacting species at the electrode surface to drop to zero, i.e., the transition time. This transition time is inversely related to the current density by the equation $$\tau = ((nF)^2 C_b^2 D)/2i_c^2 \quad (8)$$

where:

τ = transition time
n = number of electrons transferred in the electrode reaction
F = the Faraday constant
$C_b$ = concentration of the electroactive species
D = diffusion constant of the reacting species, e.g., metal ion
$i_c$ = current density From this equation it may be seen that when the pulse on-time is significantly longer than the transition time, an electrodynamic diffusion layer is established during each pulse, and tertiary effects have a significant influence on the current distribution.

An additional consideration for tertiary current distribution is the relative size of the diffusion layer and surface features. For the macroprofile case (See FIG. 2B), the roughness of the surface is large compared with the thickness of the diffusion layer, and the diffusion layer tends to follow the contour of the surface. Consequently, under mass transport or tertiary control, a macroprofile yields a uniform current distribution and a conformal deposit during plating. An the contrary, under such mass transport control, a microprofile (surface roughness small compared with the thickness of the diffusion layer, FIG. 2A) experiences non-uniform current distribution and consequent non-uniform electrolytic activity.

For a substrate with one or more features having transverse dimensions that are larger than the Nernst diffusion layer established under DC plating conditions, i.e., the hydrodynamic diffusion layer, the distribution of metal is relatively uniform if the current distribution is governed by mass transport, i.e., tertiary cathodic current distribution. If such a surface is plated using pulsed current, the electrodynamic diffusion layer will be somewhat thinner, but the surface still represents a macroprofile. Consequently, at the same average current density, the relative influence of tertiary current distribution control is less, compared to primary current distribution control. The current distribution is therefore less uniform under pulsed current plating, and shorter pulses will, in general, produce a more non-uniform current distribution.

However, the circumstances are different for a substrate according to the invention, having a surface bearing one or more features that are smaller than the DC Nernst (hydrodynamic) diffusion layer, or at least having transverse dimensions of the order of the thickness of the hydrodynamic diffusion layer. The hydrodynamic Nernst diffusion layer does not readily conform to the profile of such a surface. Accordingly, such features are hydrodynamically isolated from the bulk electrolyte. The exact upper limit to the transverse dimensions of features that experience this hydrodynamic isolation is expected to vary somewhat with the exact size, shape and depth of the features. However, it is believed that effects due to hydrodynamic isolation may be experienced in the case of features having transverse dimensions smaller than about 350 micrometers.

Such substrate surfaces accordingly present a microprofile with respect to the hydrodynamic diffusion layer. If electroplated under conditions that produce tertiary current distribution, a non-uniform metal deposit will occur. However, if the cathodic plating current is pulsed, the electrodynamic diffusion layer is substantially thinner, as pointed out above. Accordingly, the surface profile may be converted into an effective macroprofile, while maintaining tertiary current distribution conditions, which favors a uniform or conformal coating of metal.

Conversely, if the cathodic, or forward, pulse is followed by an anodic, or reverse, pulse, metal is removed from the substrate. However the metal removal should be conducted under primary and secondary control conditions and tertiary control conditions, i.e., control by mass transport across a diffusion layer, should be avoided, in order to assure a non-uniform removal of metal from the substrate. Under these conditions metal deposited during the cathodic pulse will be removed preferentially from the portions of the substrate closest to the counterelectrode, that is, from the generally planar portion of the substrate surface outside of recesses. The primary and secondary control during the anodic pulse is achieved by using a relatively low current which results in a long transition time from the beginning of the anodic pulse until the establishment of tertiary control, as indicated by Equation 8 above. It may even be possible to choose conditions of anodic pulse on-time and current that avoid the formation of an electrodynamic diffusion layer during the anodic pulse. The duration of the anodic pulse may be adjusted to achieve appropriate deplating conditions, i.e., primary and secondary control and removal of as much metal as is convenient before the next cathodic pulse occurs. Evidently, some experimentation will be required in a particular case to discover the best combination of anodic pulse current and on-time to achieve the most uniform plating of the substrate at the best overall plating rate. However, the skilled practitioner, taught by the above disclosure and the examples, will be able to select appropriate combinations of current and on-time for the cathodic and anodic pulses in order to achieve the desired metal plating on the substrate.

According to the invention the on-time of the cathodic pulse may range from about 0.83 microseconds to about 50 milliseconds, preferably from about $1\mu$ to about 10 milliseconds, more preferably from about 1.7 $\mu$s to about 5 milliseconds, and still more preferably from about 2.5 $\mu$s to 1 millisecond. The anodic pulse is longer than the cathodic pulse and may range from about 42 $\mu$s to about 99 milliseconds, preferably from about 50 $\mu$s to about 19.8 milliseconds, more preferably from about 84 $\mu$s to about 9.9 milliseconds, and still more preferably from about 125 $\mu$s to about 1.98 milliseconds.

The application of the method of the invention to filling trenches in damascene-prepared surfaces of semiconductor wafers is illustrated in FIGS. 3A–3F.

Figure 3A:
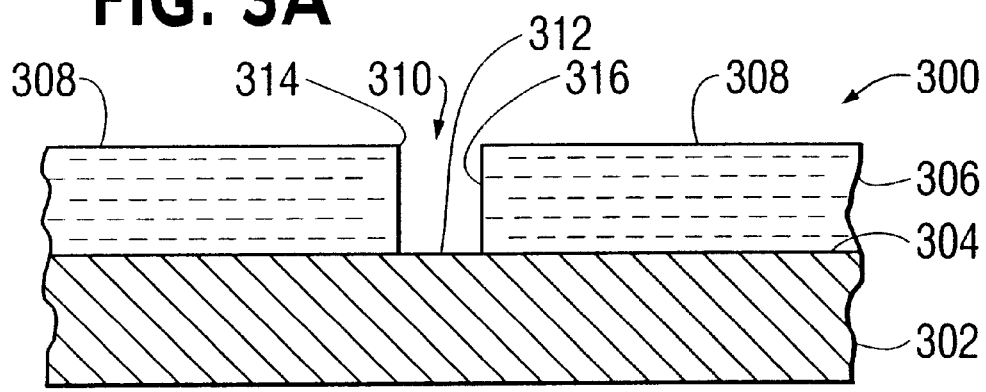
FIG. 3A is a cross section of a damascene-prepared substrate having a trench or depression formed in a layer of insulating material deposited on a semiconductor substrate.

FIG. 3A shows schematically a cross-section of a semiconductor wafer-insulating layer element 300 ready for metallizing to provide conductive traces on its surface. The element 300 comprises a semiconductor wafer 302 having formed on its surface 304 a layer of an insulating material 306, e.g., silicon dioxide. A trench 310 is formed in the insulating layer 306 by a conventional method. For example, a photoresist layer may be applied to the surface 308 of the insulating material 306, then exposed and developed to form a resist pattern on the surface 308. The patterned surface is then etched to form a trench 310, and the residual resist is removed.

In order to prepare the element 300 for depositing metal into the trench 310, a very thin barrier layer (not shown) is deposited, typically by physical vapor deposition (PVD), to prevent the metal, e.g., copper, from migrating into the semiconductor layer 302. Then a thin conducting layer (not shown) is applied (e.g., by PVD) over the entire surface of the element 300 to provide electrical conductivity for the electroplating step.

Figure 3B:
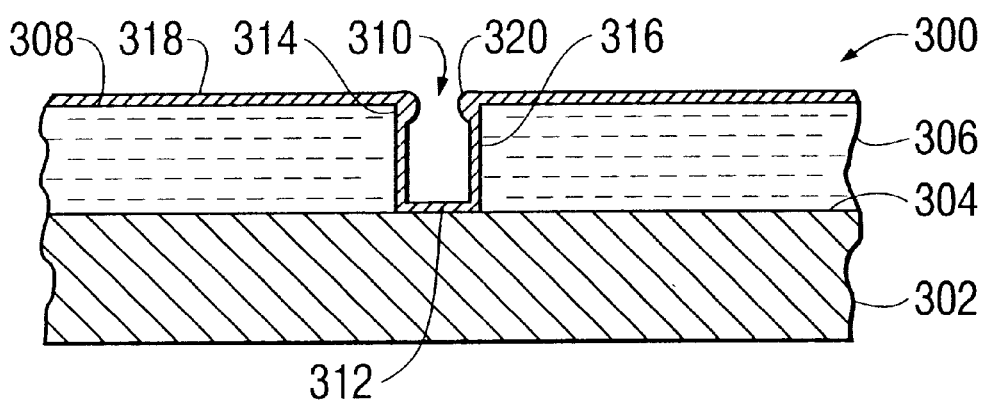
FIG. 3B is a schematic representation of the substrate of FIG. 2 after metal deposition by a cathodic pulse.

The element 300 is then immersed in a plating bath containing ions of the metal to be plated, e.g., copper ions. A counter electrode is also immersed in the plating bath, and the element to be plated 300 and the counter electrode are connected to a power supply that provides a modulated reversing electric field between the element and the counter electrode. The first pulse of the modulated reversing electric field is typically applied to make the element 300 to be plated the cathode, i.e., it is a cathodic pulse with respect to the element to be plated. The cathodic pulse causes a thin layer of metal to be plated onto the surface of the element 300, as shown in FIG. 3B. because the cathodic pulse is relatively short, the metal is deposited relatively uniformly over the surface of the element 300. However, because the pulse is of finite duration, a diffusion layer of some small thickness will develop, which may cause some non-uniformity in the layer of metal deposited. Accordingly, FIG. 3B shows some excess metal 320 deposited at the upper corners 314 of the trench 310. It will be understood by those skilled in the art that the layers of metal deposited by a single pulse are extremely thin, and the thicknesses as illustrated are necessarily exaggerated in order to show the tendency of the metal deposit established by the modulated electric field and corresponding modulated current.

Subsequent to the cathodic pulse, an anodic pulse is applied to the element 300. The anodic pulse is relatively long compared to the cathodic pulse. Accordingly, a Nernst diffusion layer tends to be more fully established during the anodic pulse. Consequently, some of the metal plated during the cathodic pulse is removed during the anodic pulse.

Figure 3C:
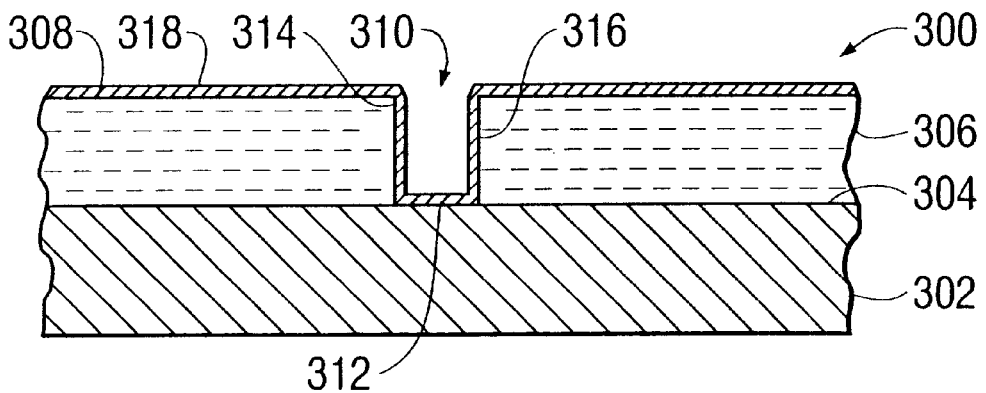
FIG. 3C is a schematic representation of the substrate of FIGS. 3A and 3B after a further treatment with an anodic pulse.

However, because the anodic pulse is of longer duration, the distribution of metal removal more closely resembles that produced by direct-current electrolysis, i.e., metal is preferentially removed from the microscopic peaks and convexities of the substrate. Accordingly, the excess metal 320 that may have been deposited during the cathodic pulse tends to be removed by the anodic pulse. The anodic pulse also tends to remove metal from the planar surface 308 of the element 300, but it tends to remove less metal from the bottom 312 and side walls 316 of the trench 310. FIG. 3C illustrates schematically the appearance of the element 300 after removal of the excess metal by the anodic pulse.

Figure 3D:
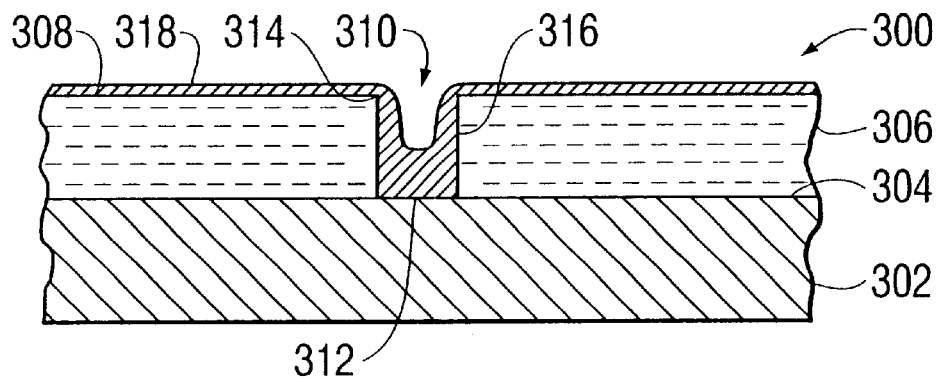
FIG. 3D is a schematic representation of the substrate of FIG. 3A after a succession of cathodic and anodic pulses, showing the preferential deposition of metal in the damascene trench.

As cathodic and anodic pulses succeed one another, the metal tends to be deposited preferentially in the trench, with reduced deposition of metal on the planar surface 308 of the element 300 and on the upper corners 314 of the trench 310. FIG. 3D illustrates schematically the distribution of deposited metal after the electroplating process using modulated revere electric fields has proceeded for some time.

Figure 3E:
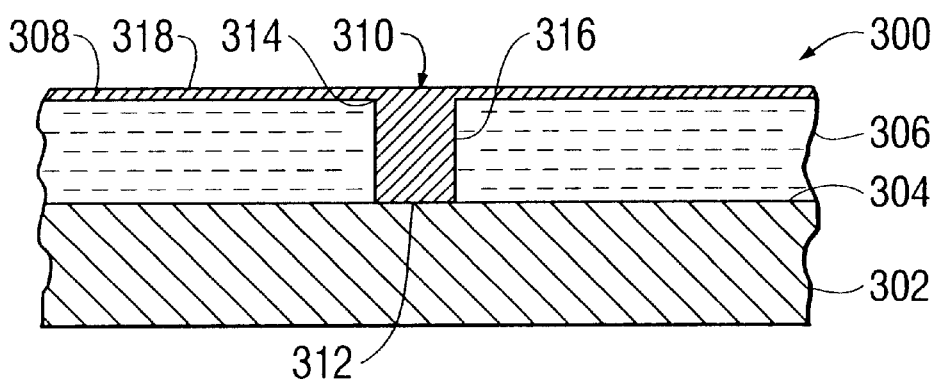
FIG. 3E is a cross section of the plated substrate of FIGS. 3A–3D after the damascene trench has been filled with metal, showing the filled trench and thin surface layer of metal.

FIG. 3E illustrates the distribution of plated metal on element 300 after the trench has been filled. The trench has been filled with solid metal, while the thickness of the plated metal layer on the planar surface 308 is relatively much thinner.

Figure 3F:
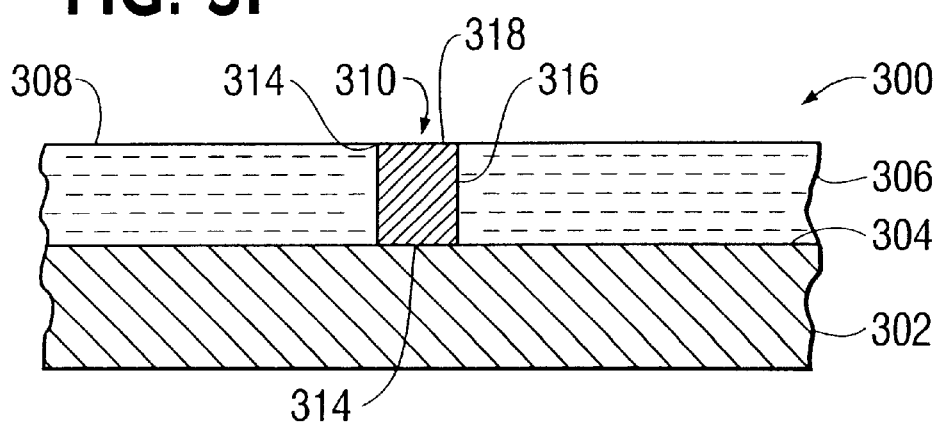
FIG. 3F is a cross section of the plated substrate of FIG. 3E after subsequent processing to remove the thin surface layer of metal.

In order to provide conductors insulated from one another by the layer 306 of insulating material, the excess metal on the planar surface 308 of the insulating material 306 is removed by any conventional procedure, e.g., by chemical-mechanical polishing (CMP), electropolishing, or other effective means. FIG. 3F shows a schematic cross section of the completed element.

Accordingly, the process of the invention, when applied to a damascene-prepared surface of a semiconductor wafer, is capable of providing solid, void-free conductors in the trenches and vias formed by the damascene process, while minimizing the amount of metal deposited on the planar surface of the element that has to be removed in a subsequent step of the manufacturing process. By adjusting the parameters of the modulated electric field waveform, e.g., the cathodic and anodic duty cycles, charge transfer ratio and frequency, the practitioner can produce a metallized damascene-prepared surface wherein the thickness of the metal layer deposited on the surface portions of semiconductor wafers metallized by the process of the invention will be no greater than the depth of metal deposited in the trenches. Preferably, the thickness of the surface layer will be substantially less than the depth of metal deposited in the trenches, e.g., no greater than about 80% of the depth of metal deposited in the trenches. More preferably, the thickness of the surface metal layer will amount to only about 50%, or 20%, or even 10% or less of the depth of metal deposited in the trenches.

The process of the invention can also be applied to deposition of a uniform metal layer on the surface of a semiconductor wafer, as is required for some manufacturing procedures. The application of the process of the invention to such wafers is illustrated in FIGS. 4A–4D.

Figure 4A:
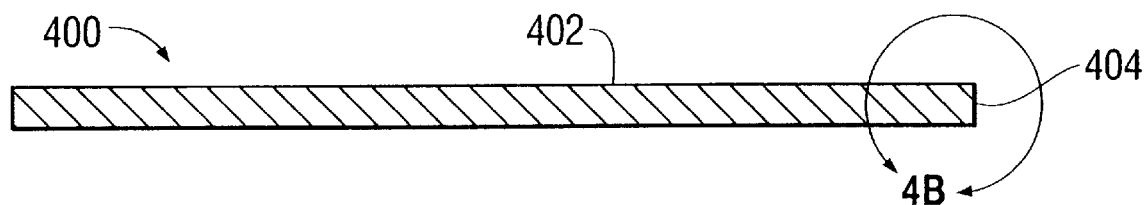
FIG. 4A is a cross section of a semiconductor wafer prepared for electrodeposition of a thin, uniform layer of metal on its surface.

FIG. 4A illustrates schematically a cross-section of a semiconductor wafer that has been cut from a single crystal of a semiconductor, e.g., silicon. Such wafers are typically round and very thin. In order to metallize the surface of the wafer a barrier layer (not shown) and a very thin conducting layer (not shown) are deposited, e.g., by CVD, as for the case of the damascene-prepared surface discussed above.

When a metal is deposited on the surface of such a wafer, the non-uniform distribution of current at the edges of the wafer gives rise to excess metal deposition at the edge. The excess metal causes the surface of the plated wafer to be somewhat nonplanar, and can interfere with subsequent manufacturing operations unless it is removed or prevented.

In order to avoid the problem of excess metal deposition at the edge of the wafer 400 without resorting to the use of auxiliary electrodes ("robbers"), shields positioned in the electroplating bath, or the like, the plating can be conducted using modulated reverse electric fields according to the invention.

Figure 4B:
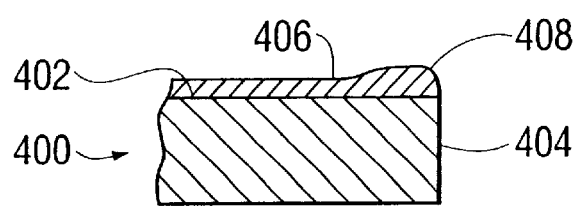
FIG. 4B shows one edge of the semiconductor wafer of FIG. 4A, indicated by circle 4B in FIG. 4A, in an enlarged view after metal deposition by a cathodic pulse, showing the excess thickness of metal deposited at the edge of the wafer with a much exaggerated vertical dimension.

FIG. 4B shows an enlarged cross section of the edge of the wafer 400 as indicated by the circle 4B in FIG. 4A. A metal layer 406 is shown schematically and with exaggerated thickness as deposited on the surface 402 of the wafer 400 near its edge 404 after the first, relatively short, cathodic current pulse. As discussed above for the damascene-prepared surface, because the cathodic pulse is of finite duration, there may be some non-uniformity in the deposition of the metal layer, as shown by the excess metal 408 deposited at the edge 404 of the wafer 400.

Figure 4C:
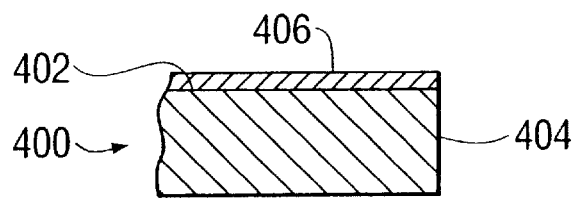
FIG. 4C shows the edge portion of the wafer edge of FIG. 4B after a subsequent anodic pulse, showing removal of excess metal near the edge of the wafer, with a greatly exaggerated vertical dimension.

FIG. 4C shows schematically the configuration of the deposited metal layer after a subsequent anodic pulse of relatively long duration. Such a long anodic pulse will remove metal non-uniformly and preferentially from the elevated and/or convex portions of the wafer surface. Accordingly, the excess metal 408 that may have been deposited by the cathodic pulse tends to be removed by a subsequent anodic pulse.

Figure 4D:
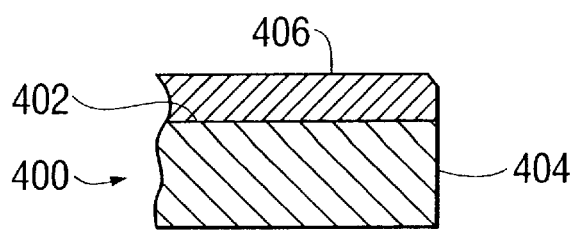
FIG. 4D shows the edge portion of the wafer of FIGS. 4A–4C after a succession of cathodic and anodic pulses, showing the thin, uniform layer of metal extending with a generally constant thickness to the edge of the wafer.

FIG. 4D shows schematically the plated metal layer 406 at the edge 404 of the wafer 400 after the plating has been completed. The plated layer 406 ideally extends smoothly and with essentially constant thickness to the edge of the wafer. Furthermore, the plated metal layer 406 will also tend to fill any microscopic depressions in the surface 402 of the wafer 400.

The method of the invention may be used with any metal that can be deposited by electroplating techniques. Thus copper, silver, gold, zinc, chromium, nickel, and alloys thereof such as bronze, brass, and the like, may be applied to microrough surfaces by the process of the invention. The invention is particularly useful in filling trenches and vias in damascene-prepared surfaces generated in the manufacture of VLSI semiconductor devices and the like and in preparing planar layers of metal on large-diameter semiconductor wafers.

The electroplating bath used in the process of the invention can be any conventional electroplating bath appropriate for the metal being plated. For electroplating copper onto a semiconductor surface, particularly when preparing microscopic conductors by the damascene process, it is preferred to avoid conventional additives such as leveling agents and the like to the extent possible, in order to avoid the difficulties of using such additives such as possible inclusion in the plated conductors. A preferred bath for electroplating copper onto a microrough surface is an aqueous acidic copper sulfate bath incorporating about 40 to about 80 g/L of copper sulfate, a molar ratio of sulfuric acid to copper sulfate of about 5:1 to about 8:1, about 5% of polyethylene glycol and about 30 ppm to about 60 ppm of chloride ion. A pulse train frequency of about 1000 Hz with a cathodic duty cycle of about 20%, an anodic duty cycle of about 75% and a cathodic/anodic charge transfer ratio of 5 or less appeared to give superior results.

Figure 5A:
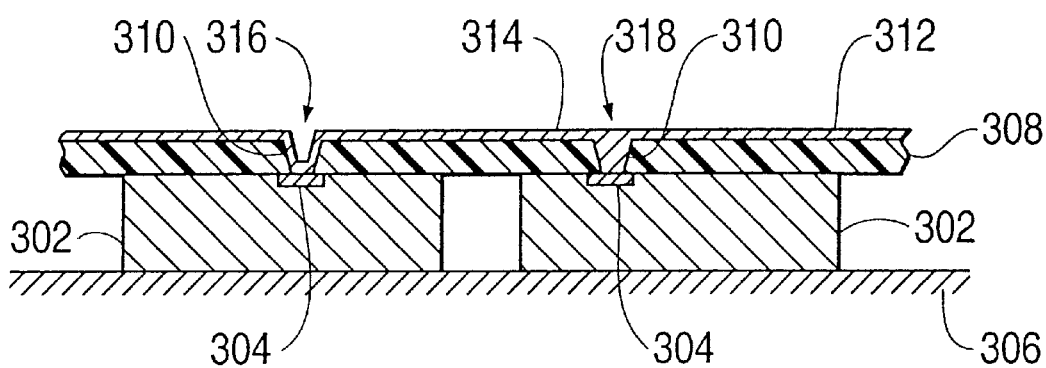
FIG. 5A illustrates a schematic cross-section of a multichip module showing the connection of one module to another through a vias prepared by the process of the invention.

The application of the filled recesses and vias prepared by the method of the invention to the high density interconnects in multichip modules is illustrated schematically in FIG. 5 Integrated circuit chips 502 shown schematically with one of the many connecting pads 504 illustrated, are supported on a conventional support, e.g. a ceramic base 506. A layer of a dielectric 508 is deposited on the upper surface of the chips 502. Small apertures or vias 510 are formed in the dielectric layer 508 by any conventional procedure, e.g., by laser ablation. In order to provide an electrically conducting substrate for the electroplating step a very thin layer (not shown) of a metal, e.g., copper, is deposited over the entire upper surface 512 of the dielectric layer 508 by conventional procedures, e.g. sputtering, physical vapor deposition, or chemical vapor deposition. The assembly is then immersed in a conventional electroplating bath for copper or other metal to be deposited on the dielectric layer 508, together with a counterelectrode. A modulated reversing electric field is impressed on the electrodes having a waveform that provides a relatively short pulse cathodic with respect to the substrate dielectric layer and a relatively long anodic pulse, as discussed above. The electric current driven by the modulated reverse electric field causes the deposition of the metal from the plating bath onto the surface of the dielectric to form a continuous layer of metal 514 over the surface 512 of the dielectric 508 and within the vias 510. The modulated reverse electric field having a waveform according to the invention tends to favor deposition of the metal in the vias 510, thereby assuring a good coating of metal in the vias 510 while avoiding an excess deposition of metal on the upper surface 512 of the dielectric layer 508. The plating is continued until the metal, e.g., copper, has reached a thickness suitable for providing high density interconnects between the semiconductor chips. If the plating is conducted for a relatively short time, the metal layer will follow the contour of the surface and interior walls and bottom of the vias to form a conformal via, as shown at 516. If the plating is continued for a longer period, the vias can be completely filled with metal to form a solid, or stud, via which can form the base for a stacked via in a subsequently formed interconnect layer, as shown at 518. Both conformal and stud vias are shown in FIG. 5 for illustrative purposes, although ordinarily only one type will be formed in a given plating step.

Figure 5B:
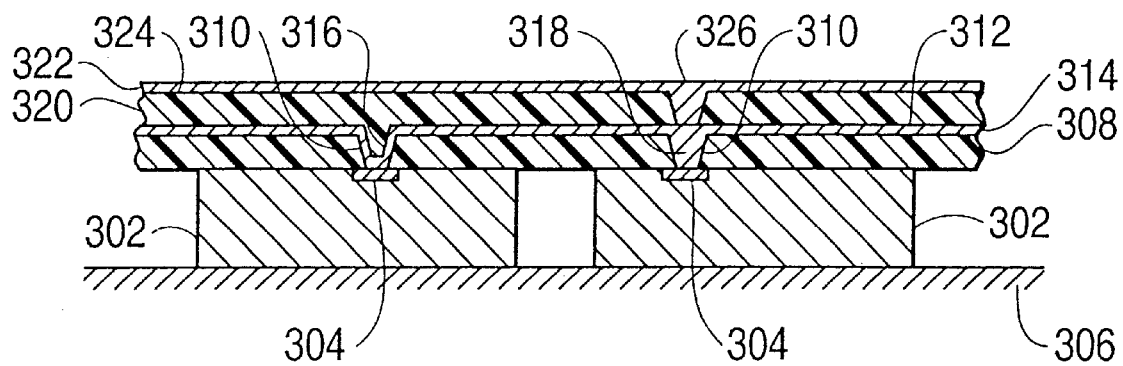
FIG. 5B illustrates a schematic cross-section of a multichip module having amore than one interconnect layer, showing the formation of stacked vias prepared by the process of the invention.

Because the process of the invention permits the easy preparation of solid, or stud, vias in a single plating step, it is useful in preparing stacked vias in multichip modules having multiple interconnect layers. Such a module is illustrated schematically in FIG. 5B, wherein a second dielectric layer 520 has been deposited on the module of FIG. 5A, and a second layer of metal 522 has been electroplated on the upper surface 524 of dielectric layer 520. The module of FIG. 5B illustrates a via 526 positioned directly above the solid via 518 in the first dielectric layer 508, to provide a direct interconnect to the surface of dielectric layer 520 or to a subsequently deposited interconnect layer.

The application of the method of the invention to filling a recess in a substrate surface is illustrated in the following examples. In the following examples copper was plated onto a brass substrate having small recesses in its surface using electric fields having several different waveforms. Electrically conducting substrates were prepared by cutting brass coupons about 19 mm (0.75 inch) square and drilling therein one or more recesses having a circular cross section of about 4 mils (102 micrometers) using small twist drill. The holes were drilled to a depth of about 150–200 micrometers, providing recesses having an aspect ratio of about 1.5:1 to 2:1.

The coupons were mounted horizontally on the lower end of a rotating electrode, which was immersed in a plating bath. The counterelectrode was a copper plate.

The plating bath comprised an aqueous solution containing 55 g/L of copper sulfate, 9% of sulfuric acid by weight, 50 parts per million (ppm) of chloride ion, and 5% by weight of a conventional polyethylene glycol carrier compound.

The electrodeposition was conducted using a number of different electric field conditions of the prior art as well as the modulated reversed electric field of the invention.

EXAMPLE 1

This example illustrates electrodeposition of copper on a brass substrate having a small recess using direct current.

Figure 6:
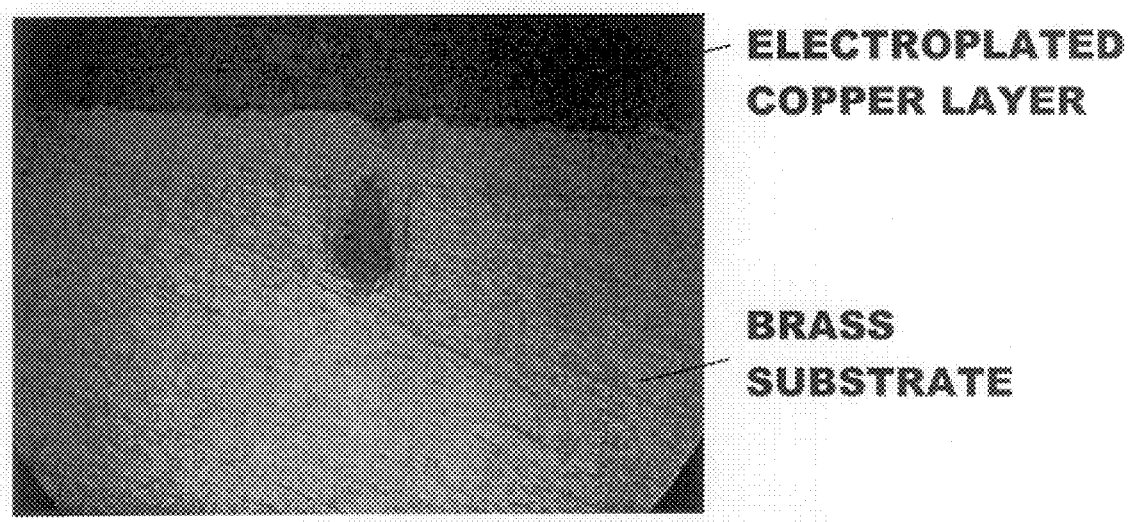
FIG. 6 is a photomicrograph of a cross section of a 102 micrometer diameter hole in a brass substrate plated with copper using direct current.

Copper was deposited on a brass coupon having a drilled hole with a diameter of about 102 micrometers using direct current at a current density of 35 mA/cm$^2$ for a period of 4 hours. The coupon was then sectioned through the hole to reveal a cross section of the copper plating on the surface of the coupon and within the recess. A photomicrograph of the plating under direct current condition is shown in FIG. 6. It is evident that relatively little copper was deposited in the recess. The plating on the surface is substantially thicker than that within the recess, and the nonuniform distribution at the upper corners of the recess has resulted in a bridge over the mouth of the recess and a substantial volume within the recess that is devoid of deposited copper. Evidently such a distribution of plated copper does not provide a reliable interconnection between the conductive copper layer on the surface and the bottom of the recess.

EXAMPLE 2

This example illustrates electrodeposition of copper on a brass substrate having a small recess using pulsed current provided by a modulated electric field.

Copper was deposited on a brass coupon having a drilled hole with a diameter of about 102 micrometers using pulsed current. The pulsed current comprised cathodic pulses separated by periods of no current. The period (T) of the pulse train was 0.293 ms (frequency 3413 Hz), and the duration of the cathodic pulse was 0.043 ms, giving a cathodic duty cycle $D_c$ of 14.7%. The average current $I_{ave}$ was 35 mA/cm$^2$ and the peak current density was 242 mA/cm$^2$. The plating was conducted for a period of 4 hours.

Figure 7:
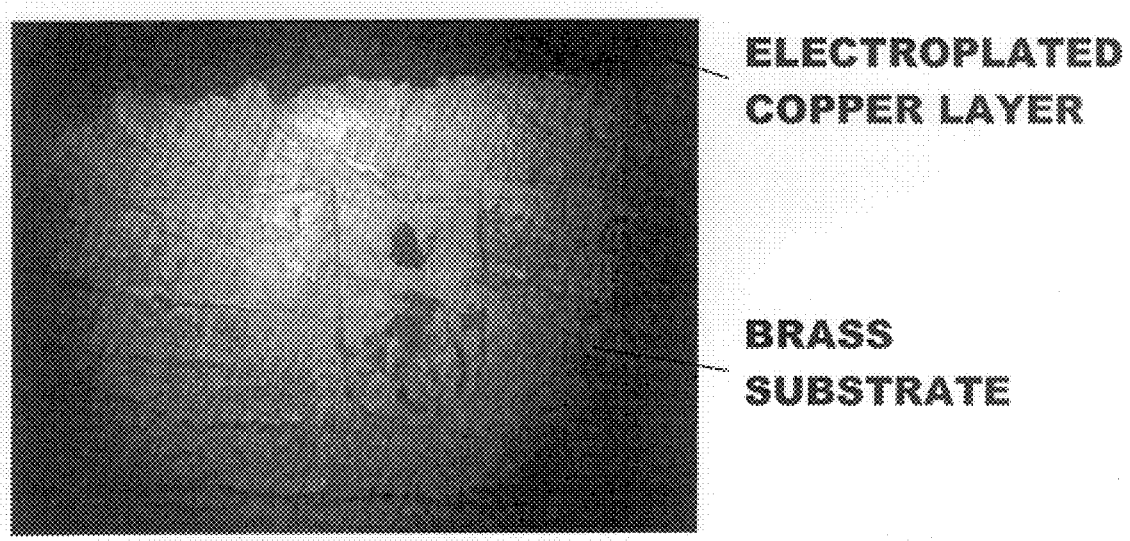
FIG. 7 is a photomicrograph of a cross section of a 102 micrometer diameter hole in a brass substrate plated with copper using pulsed current.

The coupon was then sectioned and photographed as in Example 1. A photomicrograph of the plating under pulsed current conditions is shown in FIG. 7. Although the pulsed current plating deposited more copper within the recess than the direct current plating, the deposit within the recess contains numerous voids, and the thickness of the deposit on the surface of the coupon is relatively thick. Such a distribution of plated copper is undesirable for providing a reliable, low-resistance interconnection between the conductive copper layer on the surface and the bottom of the recess.

EXAMPLE 3

This example illustrates electrodeposition of copper on a brass substrate having a small recess using modulated reverse electric field, of relatively low frequency, having a relatively long cathodic duty cycle and a relatively short anodic duty cycle. Such a waveform is representative of the modulated reverse electric fields that have been used in some processes for plating through-holes in printed circuit boards.

Copper was deposited on a brass coupon having a drilled hole with a diameter of about 102 micrometers using a modulated reverse electric field. The waveform comprised alternating cathodic and anodic pulses. The period T of the pulse train was 10.2 ms (frequency 98.13 Hz) the cathodic on-time $t_c$ was 9.2 ms and the anodic on-time was 1 ms, resulting in a cathodic duty cycle Dc of 90.2% and an anodic duty cycle of 9.8%. The ratio of cathodic current to anodic current ($I_c/I_a$) was 0.5 and the ratio of cathodic charge transfer to anodic charge transfer $Q_c/Q_a$ was 5. The average current density was 32.3 mA/cm² (30 A/ft²). The plating was conducted for a period of 3 hours.

Figure 8:
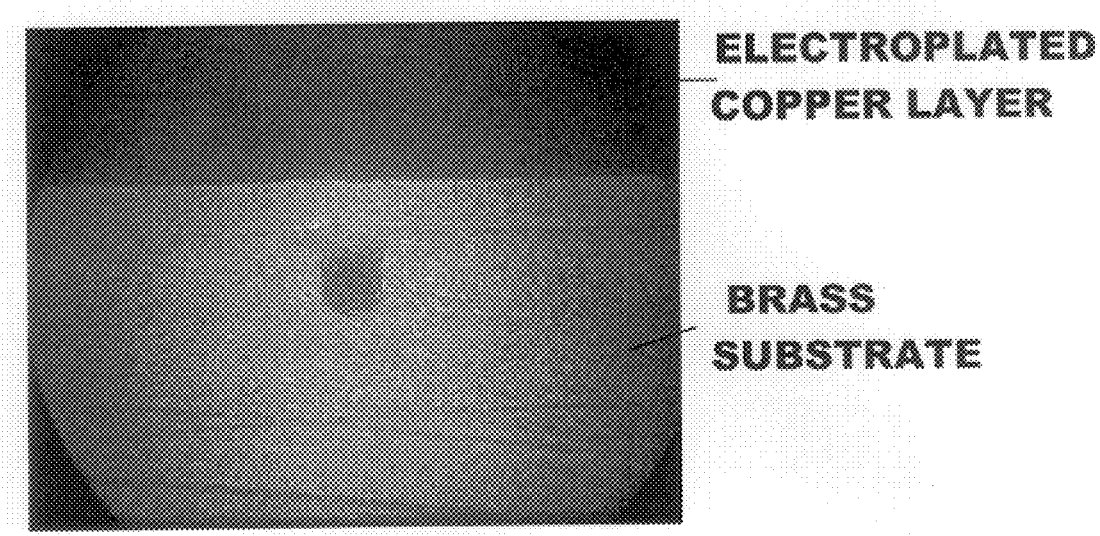
FIG. 8 is a photomicrograph of a cross section of a 102 micrometer diameter hole in a brass substrate plated with copper using modulated reverse electric fields at a relatively low frequency of 98.13 Hz with a long cathodic duty cycle and a short anodic duty cycle.

The coupon was then sectioned and photographed as in Example 1. A photomicrograph of the plating achieved with this waveform is shown in FIG. 8. The modulated reverse electric field waveform having a long cathodic duty cycle and short anodic duty cycle produced a copper deposit that was confined almost exclusively to the surface. Very little copper was deposited in the recess, leaving a large void volume within the recess and little or no copper deposit on the lower sides and bottom of the recess.

Evidently such a distribution of plated copper does not provide a reliable interconnection between the conductive copper layer on the surface and the bottom of the recess.

EXAMPLE 4

This example illustrates electrodeposition of copper on a brass substrate having a small recess using modulated reverse electric field having a relatively long cathodic duty cycle and a relatively short anodic duty cycle at a higher frequency than in Example 3. Such a waveform is representative of the modulated reverse electric fields that have been used in some processes for plating through-holes in printed circuit boards, but the frequency is substantially higher than that used in the conventional modulated reverse electric field plating methods.

Copper was deposited on a brass coupon having a drilled hole with a diameter of about 102 micrometers using a modulated reverse electric field. The waveform comprised alternating cathodic and anodic pulses. The period T of the pulse train was 0.382 ms (frequency 2617 Hz), the cathodic on-time $t_c$ was 0.054 ms, and the anodic on-time was 0.054 ms, resulting in a cathodic duty cycle $D_c$ of 86% and an anodic duty cycle $D_a$ of 14%. The ratio of cathodic current to anodic current ($I_c/I_a$) was 0.5 and the ratio of cathodic charge transfer to anodic charge transfer $Q_c/Q_a$ was 3. The average current density was 32.3 mA/cm² (30 A/ft²). The plating was conducted for a period of 3 hours.

Figure 9:
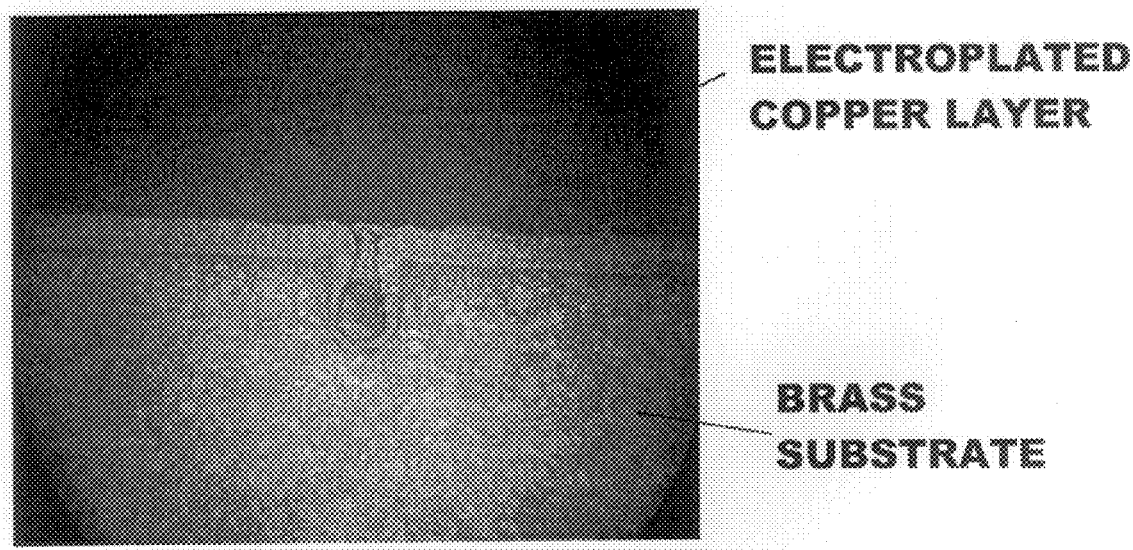
FIG. 9 is a photomicrograph of a cross section of a 102 micrometer diameter hole in a brass substrate plated with copper using modulated reverse electric fields at a relatively high frequency of 2618 Hz with a long cathodic duty cycle and a short anodic duty cycle.

The coupon was then sectioned and photographed as in Example 1. A photomicrograph of the plating achieved with this waveform is shown in FIG. 9. The high-frequency modulated reverse electric field waveform having a long cathodic duty cycle and short anodic duty cycle produced a copper deposit that was superior to that produced by the very similar low-frequency waveform. However, the thickness of the copper deposit in the lower portion of the recess was substantially thinner than that on the surface of the coupon, and the plating was nonuniform at the mouth of the recess.

Although copper deposit of this example shows a continuous film of copper over the surface of the coupon and into the recess, the film exhibits excessive thickness on the surface of the coupon, and the nonuniform plating at the mouth of the recess suggests the possibility of trapping impurities in the cavity.

EXAMPLES 5 AND 6

This example illustrates electrodeposition of copper on a brass substrate having a small recess using modulated reverse electric field according to the invention. The waveform exhibits a relatively short cathodic duty cycle and a relatively long anodic duty cycle.

Copper was deposited on a brass coupon having a drilled hole with a diameter of about 102 micrometers using a modulated reverse electric field. The waveform comprised alternating cathodic and anodic pulses. The period T of the pulse train was 0.293 ms (frequency 3413 Hz), the cathodic on-time $t_c$ was 0.043 ms, and the anodic on-time was 0.25 ms, resulting in a cathodic duty cycle Dc of 14.7% and an anodic duty cycle $D_a$ of 85.3%. The peak cathodic current density $I_{cpk}$ was 277 mA/cm² and the peak anodic current density $I_{apk}$ was 42 ma/cm², resulting in a ratio of cathodic charge transfer to anodic charge transfer $Q_c/Q_a$ of 1.2. The average current density was 15 mA/cm² (13.9 A/ft²). In Example 5, the plating was conducted for a period of 2 hours; in Example 6 the plating was conducted for a period of 4 hours.

Figure 10:
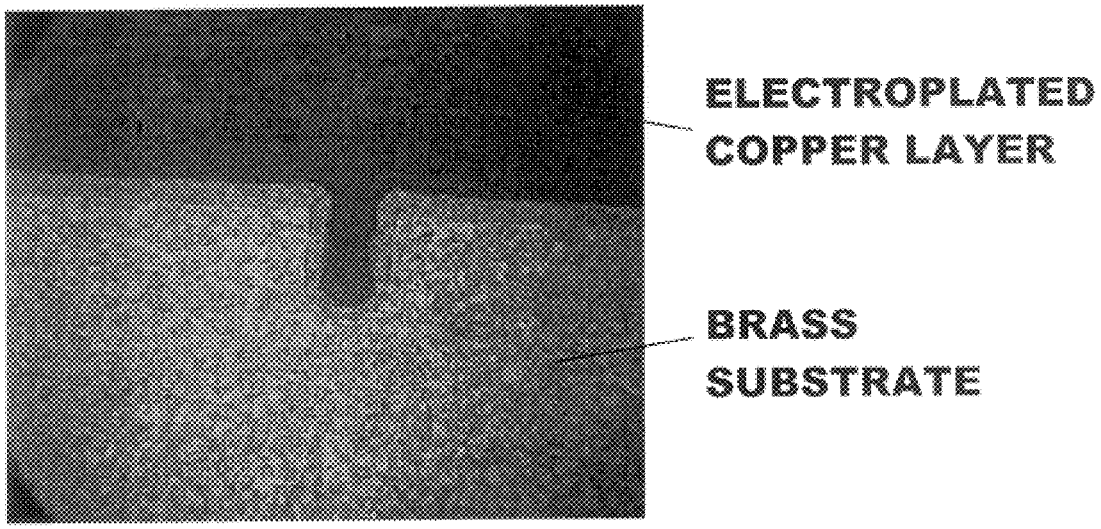
FIG. 10 is a photomicrograph of a cross section of a 102 micrometer diameter hole in a brass substrate plated with copper using modulated reverse electric fields at a relatively high frequency of 3413 Hz with a short cathodic duty cycle and a long anodic duty cycle for a period of time to plate a thin continuous layer of copper over the surface of the substrate and the interior surface of the hole.
Figure 11:
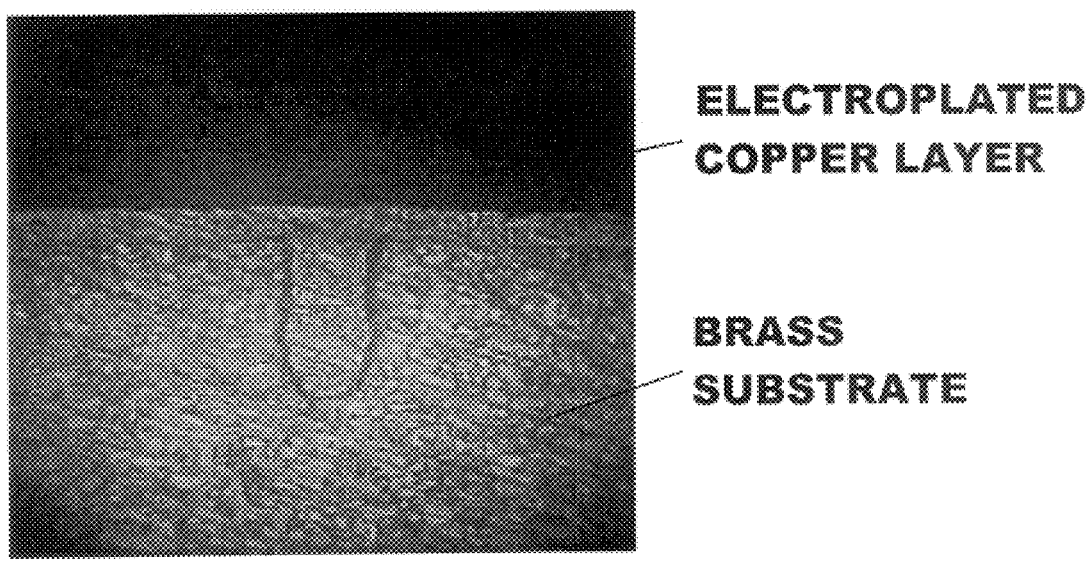
FIG. 11 is a photomicrograph of a cross section of a 102 micrometer diameter hole in a brass substrate plated with copper using modulated reverse electric fields at a relatively high frequency of 3413 Hz with a short cathodic duty cycle and a long anodic duty cycle for a period of time to plate a thin continuous layer of copper over the surface of the substrate and to fill the interior of the hole.

The coupons were then sectioned and photographed as in Example 1. A photomicrograph of the plating of Example 5 is shown in FIG. 10; a photomicrograph of the plating of Example 6 is shown in FIG. 11.

In Example 5 (2 hours plating) the copper deposit was relatively uniform over the surface of the coupon and the sides and bottom of the recess. Evidently, such a layer of electrodeposited copper is suitable for providing a reliable electrical connection between a device located at the bottom of a recess and a conductive strip on the surface of the substrate.

In Example 6 (4 hours plating) the copper deposit on the surface of the coupon is still relatively thin. However, the entire recess has been filled with electroplated copper. Accordingly, the process of the invention is capable of producing vias or blind recesses that are filled with copper (stud vias) while avoiding excess deposition of copper on the surface of the substrate.

EXAMPLES 7–11

This example illustrates the metallization of semiconductor substrates by the process of the invention.

Test coupons were prepared from silicon wafers by etching trenches into the surface using conventional masking and etching procedures. The coupons were 19 mm×19 mm with the trenches positioned in a 6.35 mm×6.35 mm area in the center of the coupon. Trenches of varying widths from about 0.25 micrometers to about 1.0 micrometers were provided. The coupons were provided with a conventional conductive seed layer of sputtered of 200 Angstrom/1000 Angstrom Ti/Cu or Cr/Cu. The coupons were mounted on a rotating disk electrode (RDE) connected as the cathode in an electroplating cell. A counter electrode was provided as an anode.

Two slightly different plating baths were used having the following compositions:

Bath 1: 60–65 g/l CuSO$_4$.5H$_2$O; 50–60 parts per million (ppm) Cl⁻; 350 ppm of polyethylene glycol (PEG) (average molecular weight, 200).

Bath 2: 60–65 g/l CuSO$_4$.5H$_2$O; 50–60 parts per million (ppm) Cl⁻; 350 ppm of polyethylene glycol (PEG) (mixture of average molecular weights 200 and 1450).

The RDE was rotated at a speed of either 400 or 800 revolutions per minute (rpm)

Two different charge modulated electric field waveforms were used:

Waveform 1: 4000–5000 Hz, cathodic duty cycle 22% (cathodic on-time ($t_c$) 44–55 microseconds), anodic duty cycle 78% (anodic on-time ($t_a$) 156–195 microseconds), average cathodic current density ($i_cD_c$) about 30 amperes per square foot (ASF).

Waveform 2: 9000 Hz, cathodic duty cycle 40–45% (cathodic on-time ($t_c$) 44–61 microseconds), anodic duty cycle 55–60% (anodic on-time ($t_a$) 61–67 microseconds), average cathodic current density ($i_cD_c$) about 30 amperes per square foot (ASF)

The plating was conducted for periods ranging from 210 to 300 seconds as indicated below.

The experimental conditions are summarized in Table 2 below.

TABLE 2

| Ex. | Trench width ($\mu$) | Plating Bath | Rotation Speed (rpm) | Waveform | Time (sec) | Cathodic peak current (mA) | Anodic peak current (mA) | Applied Charge ratio $Q_c / Q_a$ |
|---|---|---|---|---|---|---|---|---|
| 7 | 0.25 | 1 | 400 | 1 | 300 | 425 | 100 | 1.2 |
| 8 | 0.25 | 2 | 400 | 1 | 240 | 420 | 125 | 0.95 |
| 9 | 0.25 & 1.0 | 1 | 400 | 2 | 240 | 250 | 125 | 1.3 |
| 10 | 0.25 | 2 | 400 | 2 | 210 | 250 | 150–175 | 1.11 |
| 11 | 0.25 | 2 | 800 | 2 | 210 | 250 | 175 | 0.95 |

Cross sections of the trenches in the plated wafers were exposed by focused ion beam (FIB) excavation, and micrographs were prepared using a scanning electron microscope (SEM).

Figure 12:
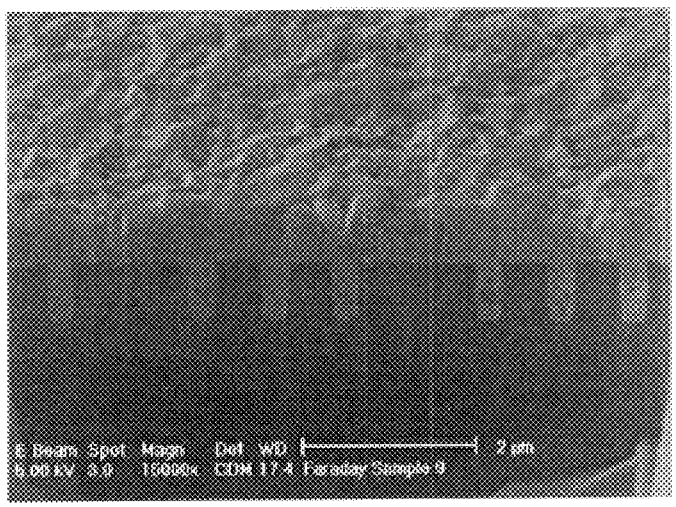
FIG. 12 is a photomicrograph of a cross-section of trenches on the surface of a silicon wafer filled by electrodeposition of copper according to Example 7.

FIG. 12 shows a cross-section of the plated trenches of Example 7. The trenches, having an aspect ratio of about 2, are fully filled and the thickness of the surface deposit is no greater than the depth of the trenches.

Figure 13:
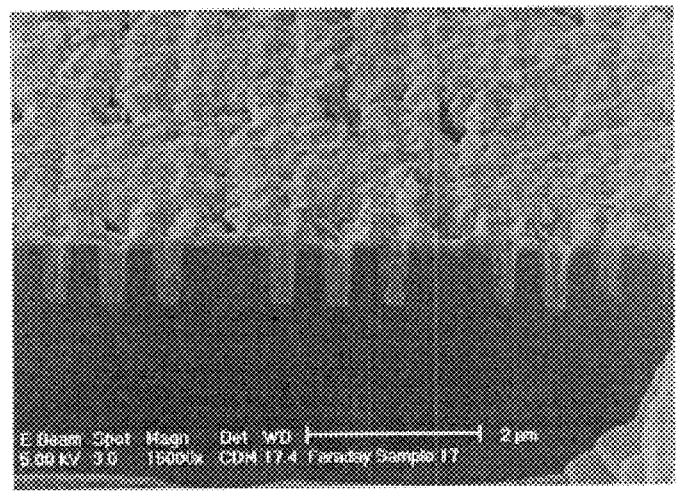
FIG. 13 is a photomicrograph of a cross-section of trenches on the surface of a silicon wafer filled by electrodeposition of copper according to Example 8.

FIG. 13 shows a cross-section of the plated trenches of Example 8. The trenches, having an aspect ratio of about 2, are conformally coated with a thin surface deposit.

Figure 14:
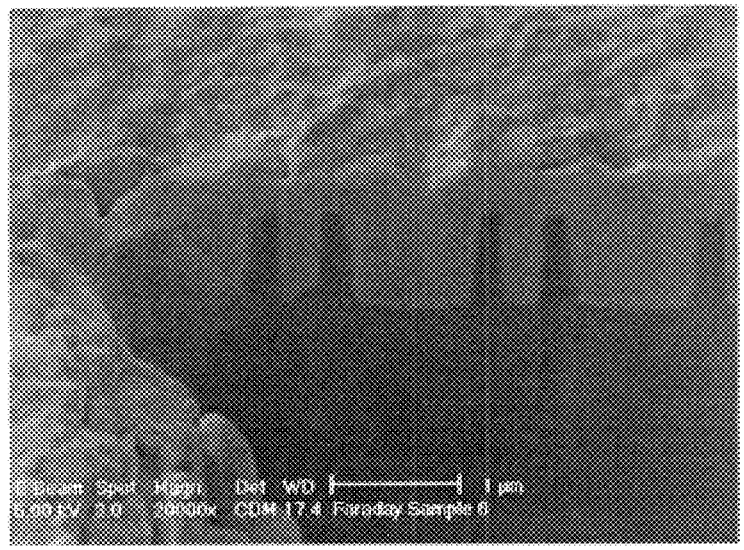
FIG. 14 is a photomicrograph of a cross-section of trenches on the surface of a silicon wafer filled by electrodeposition of copper according to Example 9.

FIG. 14 shows a cross-section of the plated trenches of Example 9. The trenches, having widths of 0.25 micrometers and 1 micrometer and a depth of about 0.6–0.7 micrometer, are fully filled with a surface plating thickness significantly less than the depth of the trenches.

Figure 15:
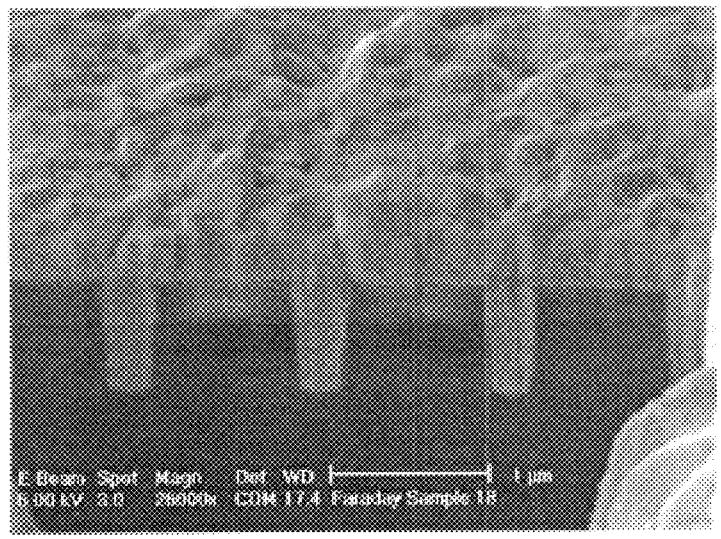
FIG. 15 is a photomicrograph of a cross-section of trenches on the surface of a silicon wafer filled by electrodeposition of copper according to Example 10.

FIG. 15 shows a cross-section of the plated trenches of Example 10. The surface plating is of moderate thickness.

Figure 16:
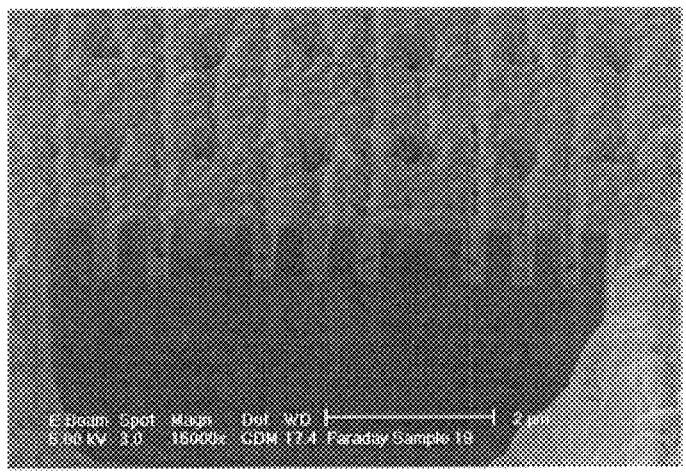
FIG. 16 is a photomicrograph of a cross-section of trenches on the surface of a silicon wafer filled by electrodeposition of copper according to Example 11.

FIG. 16 shows a cross-section of the plated trenches of Example11. The trenches have a conformal coating and the surface plating is thin.

EXAMPLE 12

This example illustrates filling of trenches having a width of about 10 micrometers.

Figure 17:
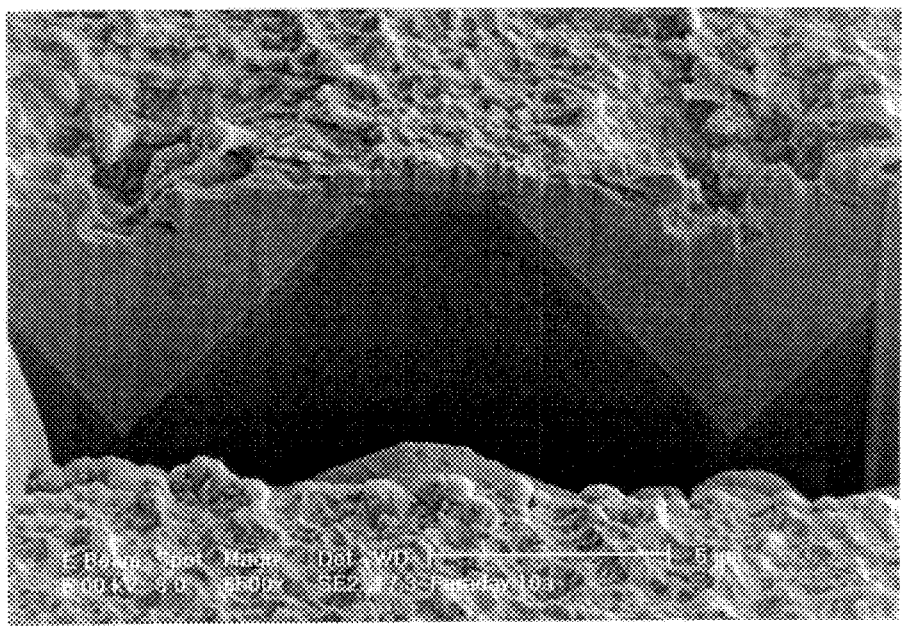
FIG. 17 is a photomicrograph of a cross-section of trenches on the surface of a silicon wafer filled by electrodeposition of copper according to Example 12.

Test coupons made from silicon wafers were prepared as in Examples 7–11, having V-shaped trenches having a top width of about 10 micrometers and a depth of about 5 micrometers. The coupons were plated in an apparatus similar to that used for Examples 7–11 for a period of 38 minutes in a bath similar to that of Example 7, using pulse reverse electric filed having a frequency of about 3500 Hz with excursions between about 2950 Hz and about 4969 Hz, a cathodic duty cycle of about 14.7%–16.7%, an anodic duty cycle of about 85.3%–83.3%, a cathodic on time of about 0.044–0.058 ms, a charge ration of about 1.16, a peak cathodic current of about 480 mA, an anodic peak current of about 80 mA, and an average current of about 11 mA. FIG. 17 shows a cross-section of the plated trenches. The trenches are fully filled and the surface plating is much thinner than the depth of the trenches.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A method for depositing a continuous layer of a metal onto a substrate having small recesses in its surface comprising:

immersing an electrically conductive substrate having a generally smooth surface having small recesses therein in an electroplating bath containing ions of a metal to be deposited onto said surface, said electroplating bath being substantially devoid of at least one member selected from the group consisting of levelers and brighteners, immersing a counter electrode in said plating bath, passing an electric current between said electrodes, wherein said electric current is a modulated reversing electric current comprising pulses that are cathodic with respect to said substrate and pulses that are anodic with respect to said substrate, the charge transfer ratio of said cathodic pulses to said anodic pulses is greater than one, and the on-time of said cathodic pulses ranges from about 0.83 microseconds to about 50 milliseconds and the on-time of said anodic pulses is greater than the on-time of said cathodic pulses and ranges from about 42 microseconds to about 99 milliseconds.

2. The method of claim 1 wherein an interval of no electric current flow is interposed between said cathodic pulses and succeeding anodic pulses.

3. The method of claim 1 wherein an interval of no electric current flow is interposed between said anodic pulses and succeeding cathodic pulses.

4. The method of claim 1 wherein an interval of no electric current flow is interposed between said cathodic pulses and succeeding anodic pulses and between said anodic pulses and succeeding cathodic pulses.

5. The method of claim 1 wherein said cathodic pulses and said anodic pulses succeed each other without intervening intervals of no electric current flow.

6. The method of claim 1 wherein said cathodic pulses and said anodic pulses form a pulse train wherein the on-time of said cathodic pulses ranges from about 1 microsecond to about 10 milliseconds and the on-time of said anodic pulses is greater than that of said cathodic pulses and ranges from about 50 microseconds to about 19.8 milliseconds.

7. The method of claim 1 wherein said cathodic pulses and said anodic pulses form a pulse train wherein the on-time of said cathodic pulses ranges from about 1.7 microseconds to about 5 milliseconds and the on-time of said anodic pulses is greater than that of said cathodic pulses and ranges from about 84 microseconds to about 9.9 milliseconds.

8. The method of claim 1 wherein said cathodic pulses and said anodic pulses form a pulse train wherein the on-time of said cathodic pulses ranges from about 2.5 microseconds to about 1 millisecond and the on-time of said anodic pulses is greater than that of said cathodic pulses and ranges from about 125 microseconds to about 1.98 milliseconds.

9. The method of claim 1 wherein said cathodic pulses have a duty cycle of from about 30% to about 1%.

10. The method of claim 1 wherein said cathodic pulses have a duty cycle of from about 30% to about 15%.

11. The method of claim 1 wherein said cathodic pulses have a duty cycle of from about 30% to about 20%.

12. The method of claim 1 wherein said anodic pulses have a duty cycle of from about 60% to about 99%.

13. The method of claim 1 wherein said anodic pulses have a duty cycle of from about 70% to about 85%.

14. The method of claim 1 wherein said cathodic pulses have a duty cycle of from about 70% to about 80%.

15. The method of claim 1 wherein said metal is selected from the group consisting of copper, silver, gold, zinc, chromium, nickel, bronze, brass, and alloys thereof.

16. The method of claim 1 wherein a layer of metal of substantially uniform thickness is deposited on said surface and within said recesses.

17. The method of claim 1 wherein the thickness of the metal layer deposited within said recesses is greater than the thickness of the metal layer deposited on said surface.

18. The method of claim 1 wherein said recesses are substantially filled with metal.

19. The method of claim 1 wherein said recess has at least one transverse dimension not greater than about 350 micrometers.

20. The method of claim 1 wherein at least one transverse dimension of said recess is from about 5 micrometers to about 350 micrometers.

21. The method of claim 1 wherein at least one transverse dimension of said recess is from about 10 micrometers to about 250 micrometers.

22. The method of claim 1 wherein at least one transverse dimension of said recess is from about 25 micrometers to about 250 micrometers.

23. The method of claim 1 wherein at least one transverse dimension of said recess is from about 50 micrometers to about 150 micrometers.

24. The method of claim 1 wherein said substrate has a microrough surface.

25. The method of claim 1 wherein said substrate is a semiconductor wafer.

26. The method of claim 1 wherein said semiconductor wafer has at lest one recess formed in its surface, said recess having at least one transverse dimension not greater than about 5 micrometers.

27. The method of claim 26 wherein said recess has at least one transverse dimension not greater than about 1 micrometer.

28. The method of claim 1 wherein said plating bath is substantially devoid of brighteners.

29. The method of claim 1 wherein said plating bath is substantially devoid of levelers.

30. The method of claim 1 wherein said plating bath is substantially devoid of brighteners and levelers.

31. The method of claim 1 wherein said metal is copper and said plating bath contains a suppressor.

32. The method of claim 31 wherein said suppressor is present in an amount of from about 100 parts per million to about 5% by weight of said plating bath.

33. The method of claim 31 wherein said suppressor is present in an amount of from about 200 parts per million to about 800 parts per million by weight of said plating bath.

34. The method of claim 31 wherein said suppressor is present in an amount of about 300 parts per million of said plating bath.

35. The method of claim 31 wherein said suppressor is an organic polyhydroxy compound.

36. The method of claim 31 wherein said suppressor is poly(ethylene glycol).

37. The method of claim 36 wherein said poly(ethylene glycol) has a molecular weight in the range of from about 1000 to about 12000.

38. The method of claim 36 wherein said poly(ethylene glycol) has a molecular weight in the range of from about 2500 to about 5000.

39. The method of claim 1 wherein said cathodic pulses have a duty cycle less than about 50% and said anodic pulses have a duty cycle greater than about 50%.

40. A method for depositing a continuous layer of a metal onto a substrate having small recesses in its surface comprising immersing, as an electrode, an electrically conductive substrate having a generally smooth surface having small recesses therein in an electroplating bath containing ions of a metal to be deposited onto said surface, said electroplating bath being substantially devoid of at least one member selected from the group consisting of levelers and brighteners, immersing a counter electrode in said plating bath, passing an electric current between said electrodes, wherein said electric current is a modulated reversing electric current comprising pulses that are cathodic with respect to said substrate and pulses that are anodic with respect to said substrate, the charge transfer ratio of said cathodic pulses to said anodic pulses is greater than one, and said cathodic pulses have an on-time and current density selected to produce electrodeposition under predominantly tertiary control and said anodic pulses have an on-time and current density selected to produce electroremoval of metal under predominantly primary and secondary control.

41. The method of claim 40 wherein said cathodic pulses have a duty cycle less than about 50% and said anodic pulses have a duty cycle greater than about 50%.

42. The method of claim 40 wherein an interval of no electric current flow is interposed between said cathodic pulses and succeeding anodic pulses.

43. The method of claim 40 wherein an interval of no electric current flow is interposed between said anodic pulses and succeeding cathodic pulses.

44. The method of claim 40 wherein an interval of no electric current flow is interposed between said cathodic pulses and succeeding anodic pulses and between said anodic pulses and succeeding cathodic pulses.

45. The method of claim 40 wherein said cathodic pulses and said anodic pulses succeed each other without intervening intervals of no electric current flow.

46. The method of claim 40 wherein said cathodic pulses and said anodic pulses form a pulse train wherein the on-time of said cathodic pulses ranges from about 1 microsecond to about 10 milliseconds and the on-time of said anodic pulses is greater than that of said cathodic pulses and ranges from about 40 microseconds to about 19.8 milliseconds.

47. The method of claim 40 wherein said cathodic pulses and said anodic pulses form a pulse train wherein the on-time of said cathodic pulses ranges from about 1.7 microseconds to about 5 milliseconds and the on-time of said anodic pulses is greater than that of said cathodic pulses and ranges from about 84 microseconds to about 9.9 milliseconds.

48. The method of claim 40 wherein said cathodic pulses and said anodic pulses form a pulse train wherein the on-time of said cathodic pulses ranges from about 2.5 microseconds to about 1 millisecond and the on-time of said anodic pulses is greater than that of said cathodic pulses and ranges from about 125 microseconds to about 1.98 milliseconds.

49. The method of claim 40 wherein said cathodic pulses have a duty cycle of from about 30% to about 1%.

50. The method of claim 40 wherein said cathodic pulses have a duty cycle of from about 30% to about 15%.

51. The method of claim 40 wherein said cathodic pulses have a duty cycle of from about 30% to about 20%.

52. The method of claim 40 wherein said anodic pulses have a duty cycle of from about 60% to about 99%.

53. The method of claim 40 wherein said anodic pulses have a duty cycle of from about 70% to about 85%.

54. The method of claim 40 wherein said cathodic pulses have a duty cycle of from about 70% to about 80%.

55. The method of claim 40 wherein said metal is selected from the group consisting of copper, silver, gold, zinc, chromium, nickel, bronze, brass, and alloys thereof.

56. The method of claim 40 wherein a layer of metal of substantially uniform thickness is deposited on said surface and within said recesses.

57. The method of claim 40 wherein the thickness of the metal layer deposited within said recesses is greater than the thickness of the metal layer deposited on said surface.

58. The method of claim 40 wherein said recesses are substantially filled with metal.

59. The method of claim 40 wherein said recess has at least one transverse dimension not greater than about 350 micrometers.

60. The method of claim 40 wherein at least one transverse dimension of said recess is from about 5 micrometers to about 350 micrometers.

61. The method of claim 40 wherein at least one transverse dimension of said recess is from about 10 micrometers to about 250 micrometers.

62. The method of claim 40 wherein at least one transverse dimension of said recess is from about 25 micrometers to about 250 micrometers.

63. The method of claim 40 wherein at least one transverse dimension of said recess is from about 50 micrometers to about 150 micrometers.

64. The method of claim 40 wherein said substrate has a microrough surface.

65. The method of claim 40 wherein said substrate is a semiconductor wafer.

66. The method of claim 40 wherein said semiconductor wafer has at lest one recess formed in its surface, said recess having at least one transverse dimension not greater than about 5 micrometers.

67. The method of claim 66 wherein said recess has at least one transverse dimension not greater than about 1 micrometer.

68. The method of claim 40 wherein said plating bath is substantially devoid of brighteners.

69. The method of claim 40 wherein said plating bath is substantially devoid of levelers.

70. The method of claim 40 wherein said plating bath is substantially devoid of brighteners and levelers.

71. The method of claim 40 wherein said metal is copper and said plating bath contains a suppressor.

72. The method of claim 71 wherein said suppressor is present in an amount of from about 100 parts per million to about 5% by weight of said plating bath.

73. The method of claim 71 wherein said suppressor is present in an amount of from about 200 parts per million to about 800 parts per million by weight of said plating bath.

74. The method of claim 71 wherein said suppressor is present in an amount of about 300 parts per million of said plating bath.

75. The method of claim 71 wherein said suppressor is an organic polyhydroxy compound.

76. The method of claim 71 wherein said suppressor is poly(ethylene glycol).

77. The method of claim 76 wherein said poly(ethylene glycol) has a molecular weight in the range of from about 1000 to about 12000.

78. The method of claim 76 wherein said poly(ethylene glycol) has a molecular weight in the range of from about 2500 to about 5000.

* * * * *